US006525541B1

(12) United States Patent
Leopold

(10) Patent No.: US 6,525,541 B1
(45) Date of Patent: Feb. 25, 2003

(54) ELECTRIC CIRCUIT INTERRUPTER WITH FAIL SAFE MODE AND METHOD

(75) Inventor: Howard S. Leopold, Melville, NY (US)

(73) Assignee: Eagle Electric Manufacturing Co., Inc., Long Island City, NY (US)

( * ) Notice: Subject to any disclaimer, the term of this patent is extended or adjusted under 35 U.S.C. 154(b) by 0 days.

(21) Appl. No.: 09/717,380

(22) Filed: Nov. 22, 2000

Related U.S. Application Data

(60) Provisional application No. 60/167,215, filed on Nov. 24, 1999.

(51) Int. Cl.7 ................................................ G01R 31/00

(52) U.S. Cl. ......................... 324/508; 324/424; 361/47; 361/115

(58) Field of Search ................................ 324/508, 509, 324/510, 424; 361/42, 45, 47, 44, 115; 335/6, 18

(56) References Cited

U.S. PATENT DOCUMENTS

| | | | | |
|---|---|---|---|---|
| 3,932,790 A | | 1/1976 | Muchnick | 317/18 D |
| 4,002,951 A | * | 1/1977 | Halbeck | 317/18 D |
| 4,280,092 A | | 7/1981 | Wells, Jr. et al. | 324/51 |
| 4,292,585 A | | 9/1981 | Charette | 324/51 |
| 4,595,894 A | * | 6/1986 | Doyle et al. | 335/18 |
| 4,816,957 A | | 3/1989 | Irwin | 361/45 |
| 4,829,289 A | | 5/1989 | Kallman et al. | 340/656 |
| 5,363,269 A | | 11/1994 | McDonald | 361/45 |
| 5,459,630 A | | 10/1995 | MacKenzie et al. | 361/45 |
| 5,477,412 A | | 12/1995 | Neiger et al. | 361/45 |
| 5,481,194 A | | 1/1996 | Schantz et al. | 324/522 |
| 5,515,218 A | | 5/1996 | DeHaven | 361/45 |
| 5,594,398 A | * | 1/1997 | Marcou et al. | 335/16 |
| 5,642,052 A | | 6/1997 | Earle | 324/556 |
| 5,715,125 A | | 2/1998 | Neiger et al. | 361/42 |
| 5,726,900 A | | 3/1998 | Walter et al. | 364/483 |
| 5,754,114 A | | 5/1998 | Gnadt | 340/649 |
| 5,825,599 A | | 10/1998 | Rosenbaum | 361/45 |
| 5,875,087 A | | 2/1999 | Spencer et al. | 361/87 |
| 5,933,063 A | * | 8/1999 | Keung et al. | 335/18 |
| 5,956,218 A | | 9/1999 | Berthold | 361/42 |
| 5,966,280 A | | 10/1999 | Cerminara et al. | 361/47 |
| 5,982,593 A | | 11/1999 | Kimblin et al. | 361/42 |
| 6,052,265 A | | 4/2000 | Zaretsky et al. | 361/42 |

FOREIGN PATENT DOCUMENTS

| | | |
|---|---|---|
| DE | 41 06 652 | 9/1992 |

* cited by examiner

*Primary Examiner*—Christine Oda
*Assistant Examiner*—Etienne P LeRoux
(74) *Attorney, Agent, or Firm*—Morgan, Lewis & Bockius LLP

(57) ABSTRACT

The fault circuit interrupter with fail safe mode and method can include a detection circuit for determining whether an error has occurred in an exterior circuit, and an interrupter device for stopping current flow to the exterior circuit when an error has been detected. The fault circuit interrupter can also include a fail safe mode, wherein if any of the fault circuit interrupter's key electrical and/or mechanical components malfunction or are not working, the fault circuit interrupter is incapable of being reset after a trip.

19 Claims, 40 Drawing Sheets

ELECTRIC CIRCUIT INTERRUPTER WITH FAIL SAFE MODE AND METHOD

RELATED APPLICATIONS

This application claims benefit to U.S. Provisional Patent Application No. 60/167,215 filed on Nov. 24, 1999, which is hereby incorporated by reference.

This application is also related to two U.S. non-provisional, utility patent applications which are commonly owned by the assignee of this application and which are incorporated by reference. The related non-provisional applications are: Application Ser. No. 09/251,426, by inventors Yuliy Rushansky and Howard S. Leopold, entitled "STANDOFF ASSEMBLY AND METHOD FOR SUPPORTING AN ELECTRICAL COMPONENT", filed Feb. 17, 1999; and Application Ser. No. 09/251,427, by inventors Howard S. Leopold and Yuliy Rushansky, entitled "ELECTRICAL CIRCUIT INTERRUPTER", filed Feb. 17, 1999.

BACKGROUND OF THE INVENTION

1. Field of the Invention

The invention relates to an error detection circuit interrupter device that includes a detection circuit for determining whether an error has occurred in an exterior circuit and includes an interrupter device for stopping current flow to the exterior circuit when an error has been detected. More particularly, the invention relates to a ground fault circuit interrupter device (GFCI) with a fail safe mode, wherein the GFCI is incapable of being reset after a trip if any of its key electrical components malfunction or are not working.

2. Description of the Related Art

Fault or error detection devices are well known in the art to provide additional safety for electrical components. A specific type of fault or error detection device is know as a GFCI device. In operation, a GFCI type device supplies electricity to an exterior circuit and opens an outlet circuit when a ground fault occurs in the exterior circuit, i.e., when a portion of a circuit that is plugged into the outlet becomes grounded. For example, if a hair dryer is dropped into a bathtub, electricity may flow from the hair dryer circuit to ground through the bathtub water. A person might be part of the current path to ground. An electrical outlet provided with a GFCI device will detect such a ground fault and, almost instanteously, open the outlet circuit to prevent current from flowing from the hair dryer circuit to ground. Although the GFCI device is described above as being associated with an outlet, the typical GFCI device can be associated with other different types of electrical junctures.

Conventional GFCI devices include a detection circuit that compares the current leaving the outlet circuit to the current returning to the outlet circuit. When there is a pre-set differential between the leaving and returning outlet currents, the GFCI opens the outlet circuit and indicates that a ground fault has occurred. The detection circuit can be constructed in a number of different ways, including providing a differential transformer for sensing the imbalance in the current flow. In addition, there are many different structures that have conventionally been used to open the circuit once the ground fault has been detected. For example, some conventional GFCI devices use a trip coil to open the outlet circuit. A test and reset button are also typically provided on the GFCI device for testing whether the device is functioning properly and for resetting the device after testing or after the device has been tripped. Conventional GFCI devices are often complicated structures that require sophisticated manufacturing processes to ensure that they work properly and safely. The GFCI device disclosed in U.S. Application Ser. No. 09/251,427, like most conventional GFCI devices, does not have a structure for ensuring that the GFCI device cannot be reset when one or more key electrical components, such as the transformer, integrated circuit (IC), solenoid, and solenoid controlling devices, are not operable. For example, in the GFCI device of Application Ser. No. 09/251,427, if the GFCI unit trips because of a ground fault, the unit can be manually reset by depressing the reset button. If one of the key electrical components is damaged due to the ground fault or by any other means, the GFCI can still be reset so that electricity would be provided to the electrical outlet. In this case however, the GFCI will no longer be able to detect another ground fault and thus will no longer be able to stop current flow to the exterior circuit. Several other drawbacks also exist in other conventional GFCI devices, including high manufacturing cost, poor reliability, poor endurance, potential safety concerns due to excessive heat generation and/or poor reliability, and general aesthetic and ergonomic drawbacks.

SUMMARY OF THE INVENTION

An object of the invention is to provide a fault/error detection device that is economic to manufacture, requires as few parts as possible and operates at a high level of reliability. Another object of the present invention is to provide a GFCI device that is incapable of being reset after a trip if any of the key electrical components become inoperable. Another object of the invention is to provide a GFCI device that is simple to manufacture and includes as few parts as possible while also providing the structural stability necessary for the device to be tested on a regular basis. Another object of the invention is to provide a GFCI device that includes a test light indicator that will indicate when the GFCI device has been tripped, and whether the GFCI device is wired correctly.

To achieve these and other advantages and in accordance with the purpose of the invention, as embodied and broadly described, the invention provides a GFCI device with a fail safe mode for preventing restoration of current flow through a first circuit when a component of the GFCI device is malfunctioning or otherwise inoperable. The ground fault circuit interrupter device can include a housing, a substructure located in the housing, a ground fault detector located on the substructure and capable of detecting whether a ground fault has occurred in the first circuit, a current path structure located on the substructure and having a first end terminating at an input connector and a second end terminating at an output connector, the current path structure including no more than one electrical splice, a pair of contact points located in the current path structure and displaceable from each other to open the current path structure and cause current to stop flowing in the first circuit when the ground fault detector detects that a ground fault has occurred, wherein the means for displacing the contact points includes a latch biased towards a predetermined position by a hairspring at one end and a armature within a solenoid at another end, where displacement of the armature in a predetermined direction causes displacement of the latch to ultimately allow displacement of the contact points.

In accordance with another aspect of the invention, the GFCI device can include a thermally activated part that, upon being heated by an overheated solenoid coil, moves into a position to block the ability for the GFCI device to be reset. The GFCI reset ability can be blocked by preventing normal movement of the latch or preventing normal movement of the armature. The overheated solenoid is an indication that the GFCI device is malfunctioning and therefore should not be permitted to be reset. The thermally activated part can be, for example, a thermocouple connected to an electrical switching device that moves a locking mechanism into contact with either the latch or the armature when a predetermined "solenoid overheating" temperature is sensed by the thermocouple.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate one embodiment of the invention and together with the written description serves to explain the principles of the invention. In the drawings.

DETAILED DESCRIPTION OF THE PREFERRED EMBODIMENTS

Reference will now be made in detail to the present preferred embodiment of the invention, an example of which is illustrated in the accompanying drawings.

Figure 1A:
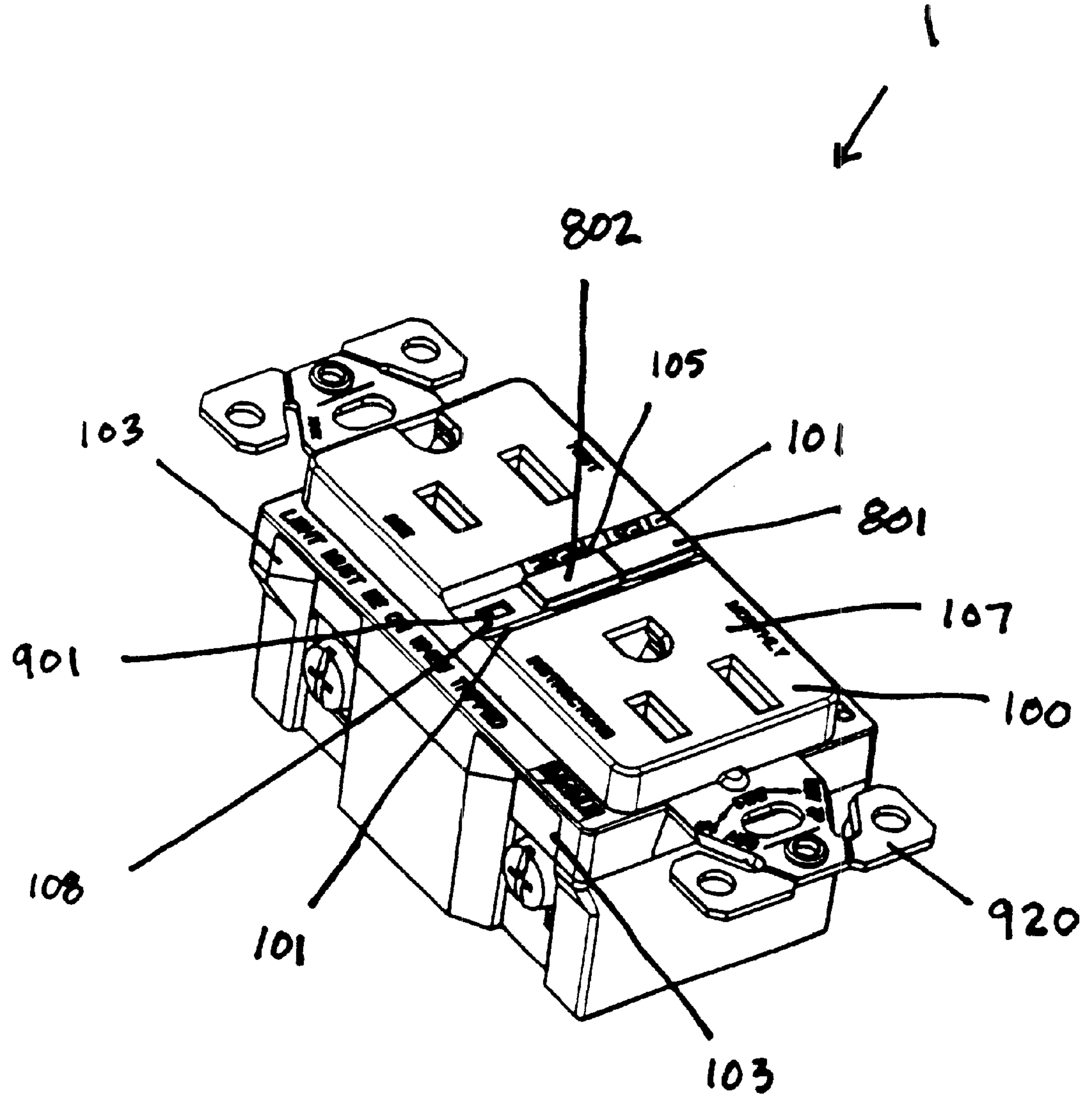
FIGS. 1A and 1B are first and second perspective views of a GFCI device embodying the principles of the invention.

FIG. 1A shows a GFCI device 1 that is constructed in accordance with the principles of the invention. The GFCI device can have a top housing cover 100 that is constructed of a size and shape that is consistent with industry standards for an electrical outlet. Preferably, the device includes two sets of receptacle openings for receiving standard plugs. A test/reset aperture can be located along a mid-line of the top housing cover 100 and include a test button 801 and reset button 802 located therein. A light aperture 108 can also be located on the mid-line of the top housing cover 100 to enclose a light for indicating whether the GFCI device has been tripped due to either a ground fault detection or a test of the device. The light can also indicate whether the GFCI device has been correctly wired and whether the key electrical components are functioning properly.

Top and bottom angled indicia surfaces 101 can be provided on either side of the mid-line and include indicia thereon. The indicia can include numerals, letters, symbols or other markings that can be viewed from the exterior of the GFCI device and which preferably provide an instructional message to a viewer. In the embodiment depicted in FIG. 1A, the indicia comprise the terms "test" and "reset" to instruct a viewer of the function of the buttons located adjacent the indicia surfaces. The angled indicia surfaces are preferably sloped at a 45° angle with respect to the substantially planar face surface 107 of the top housing cover 100 so that the indicia can be read from above and below the GFCI device. Accordingly, a user can read the indicia on the angled indicia surfaces 101 regardless of the orientation of the GFCI device when installed. Furthermore, it should be appreciated that this preferred configuration de-emphasizes the visual appearance of indicia on the top indicia surface and emphasizes indicia located on the bottom indicia surface when viewed from above, e.g., when the device is installed in a wall.

A mounting strap 920 extends from either side of the top housing cover 100 for attaching the GFCI device to a wall box. Indents 103 can be provided on either side of the top housing cover 100 to facilitate connection to electrical wires.

Figure 1B:
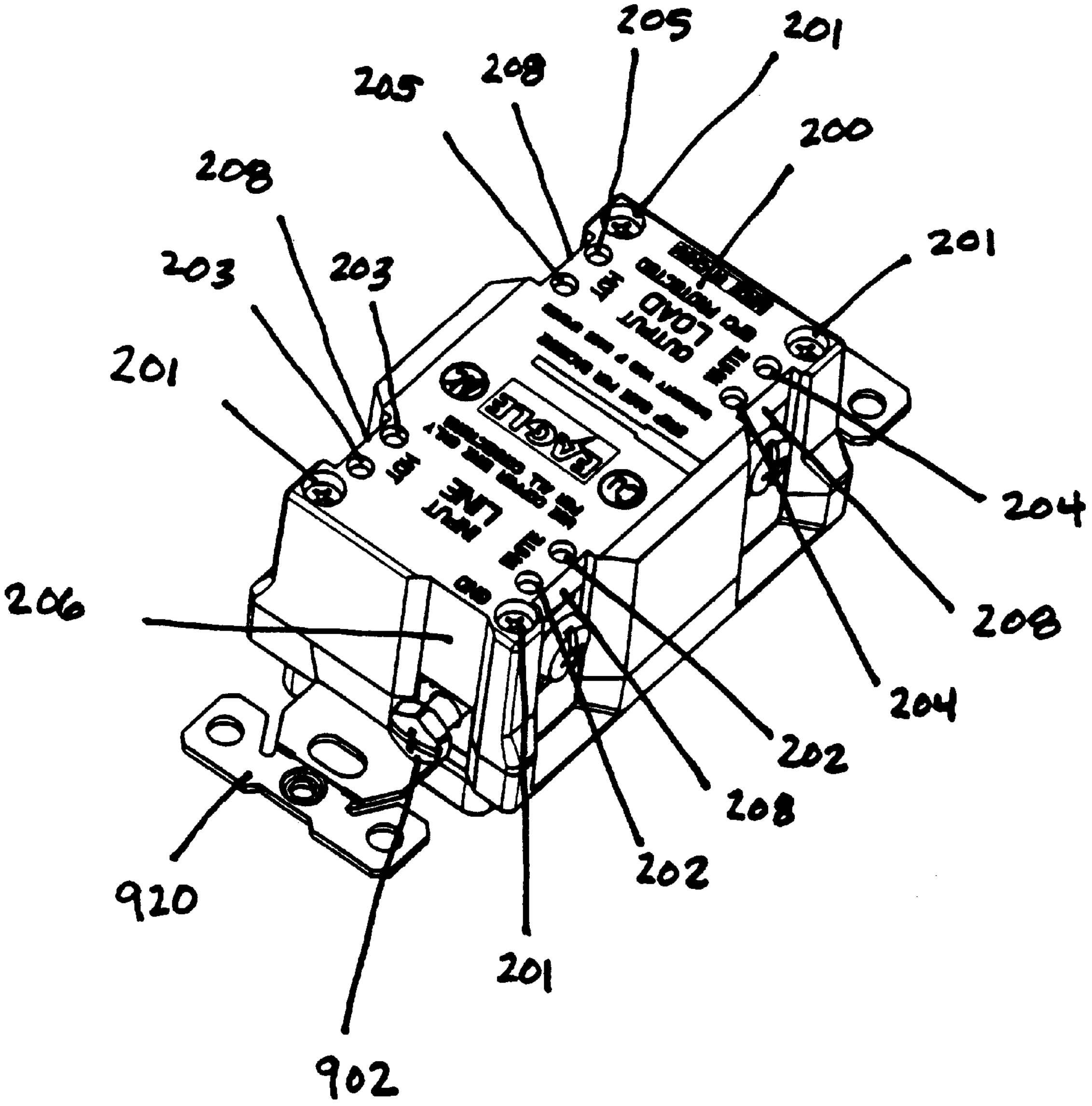

FIG. 1B shows an isometric view of the bottom housing cover 200 which is attached to the top housing cover 100 via screws inserted through the connection holes 201 in the bottom housing 200. Neutral connection holes 202 and hot connection holes 203 are located in the bottom housing cover 200 to provide an alternate connection for input wires onto the GFCI circuit. In addition, neutral connection holes 204 and hot connection holes 205 are located on the bottom housing cover 200 to provide an alternate attachment structure for output wires leading from the GFCI circuit. A wide pathway 206 can be located at one end of the periphery of the bottom housing cover 200 to facilitate attachment of a U-shaped wire connector to the grounding screw of the GFCI device. Indents 208 may also be provided on the bottom housing cover 200 and aligned with the indents 103 of the top housing cover 100 to provide clearance for U-shaped wire attachment structures for input and output wires.

Figure 2:
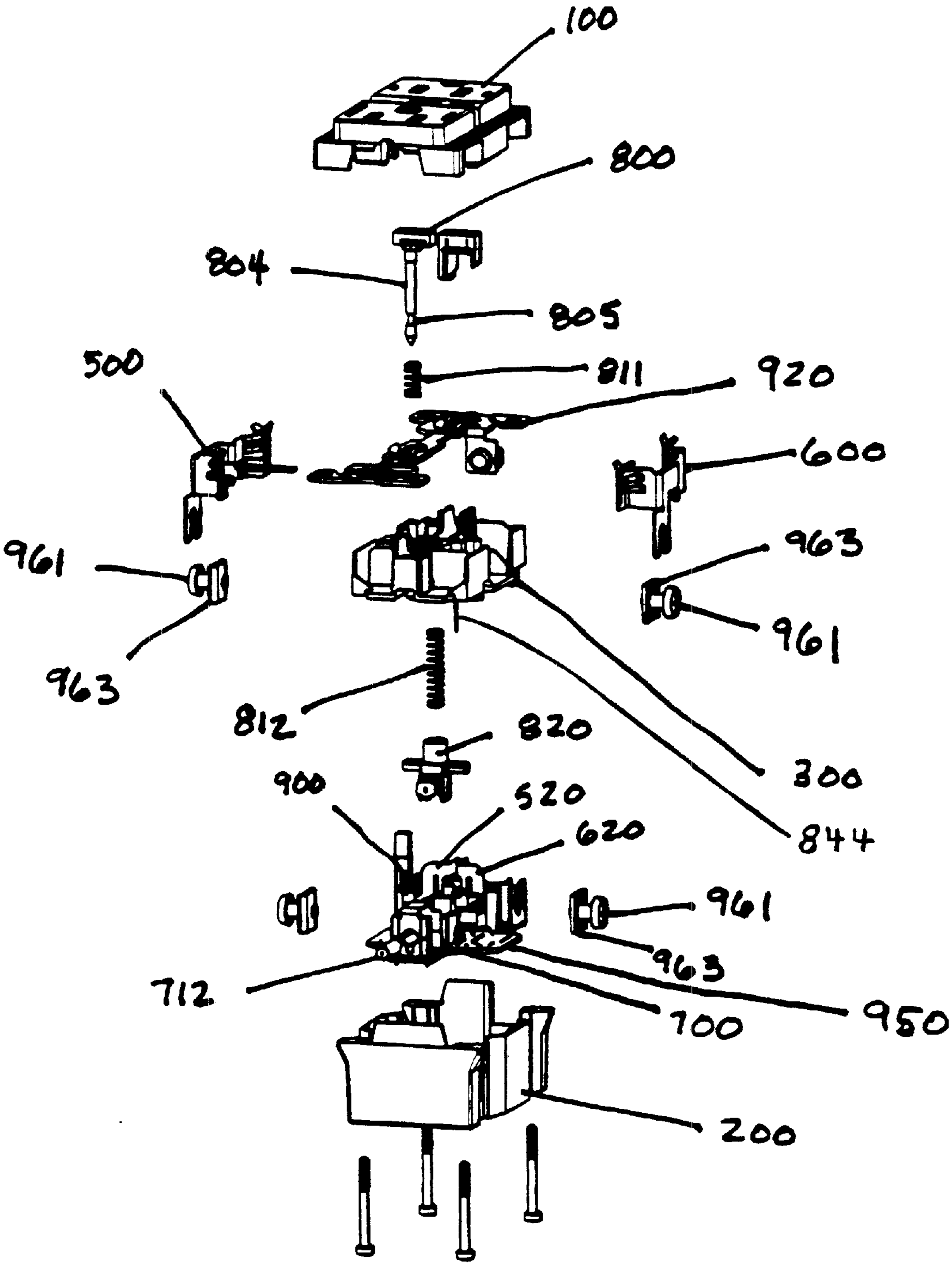
FIG. 2 is an exploded view of the GFCI device of FIGS. 1A and 1B.

As shown in FIG. 2, the top housing cover 100 and the bottom housing cover 200 encase the GFCI components and circuitry including a middle housing 300 and circuit board 950 therebetween. The middle housing 300 is located above the circuit board 950 and adjacent the top housing cover 100. The circuit board 950 rests adjacent the bottom wall of the bottom housing cover 200. The middle housing 300 can be a one piece molded structure that has a plurality of ribs thereon to located and stabilize the GFCI circuit components. A mounting strap 920 can be sandwiched between the top housing cover 100 and the middle housing 300 and extend from either end of the GFCI device so that the GFCI device can be mounted to a conventional wall box.

The GFCI circuitry as shown in FIG. 2 includes a transformer device for detecting a ground fault, a solenoid trip device for causing both current pathways of the GFCI device to open, and a test/reset structure for periodically testing the GFCI device and for resetting the GFCI device after it has been either tested or tripped.

Figure 3A:
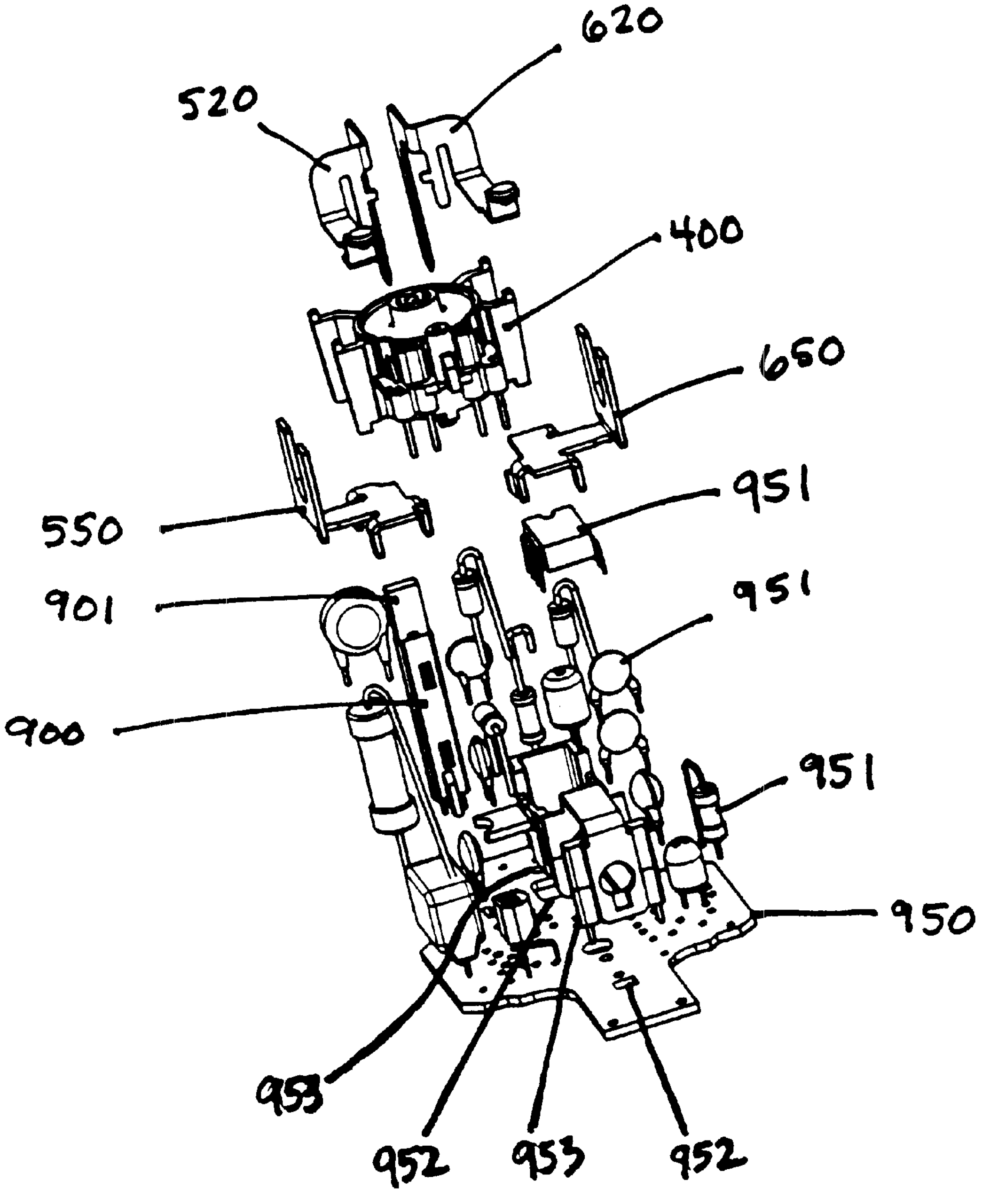
FIGS. 3A and 3B are exploded and unexploded perspective views, respectively, of the PC board assembly as shown in FIG. 2.
Figure 3B:
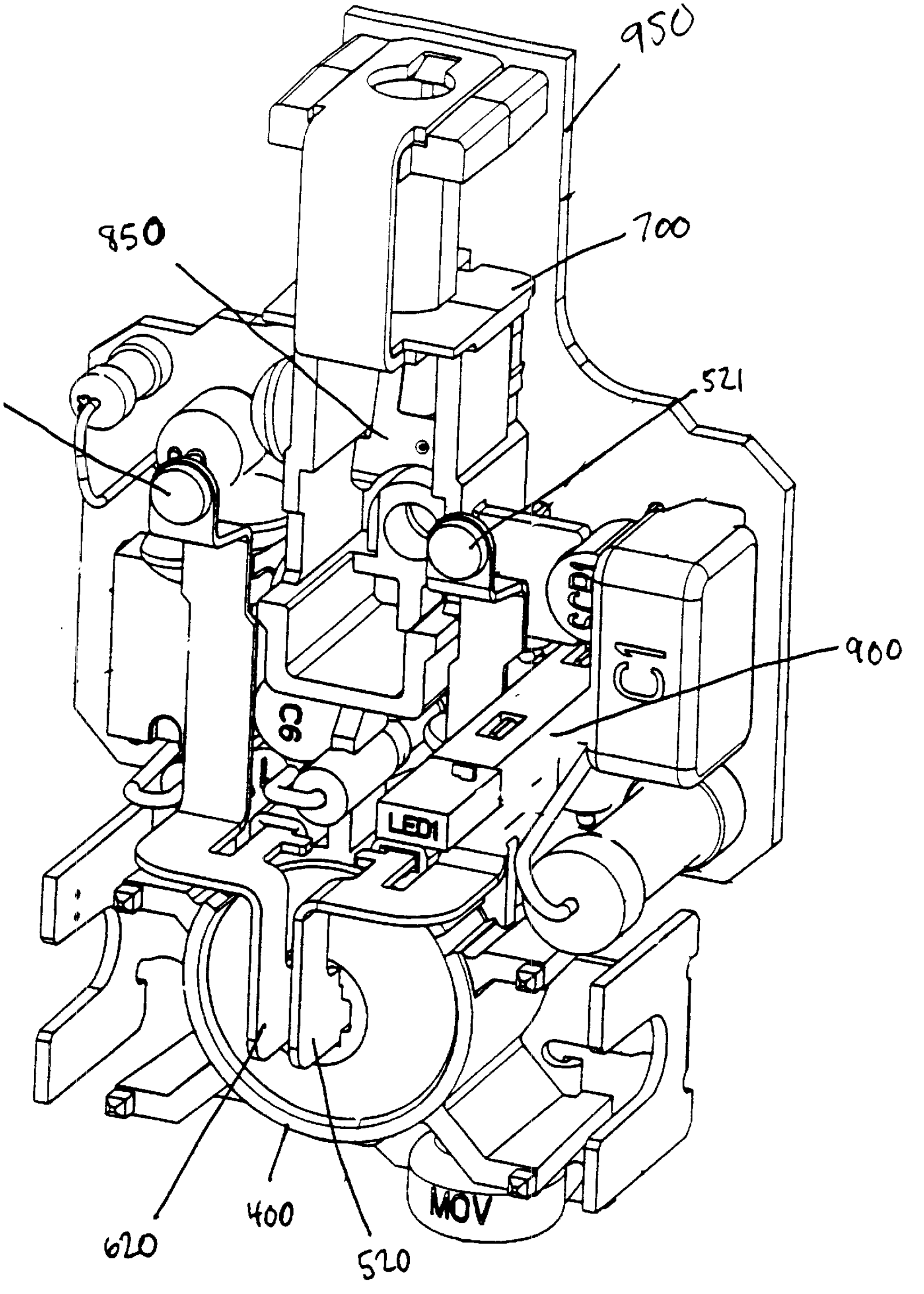

FIGS. 3A and 3B depict an exploded view and an isometric view, respectively, of the electronic components 951 and other various components that are located on the circuit board 950 of the GFCI device. The electronic components 951 include resistors, capacitors and other well known electronic circuit components for comprising a GFCI circuit. The electronic components 951 can be attached to the circuit board 950 via any well known attachment method, e.g., by soldering. The circuit board 950 can include clip apertures 952 and pivot apertures 953 for attaching the transformer boat 400 and the solenoid bobbin 700 quickly and easily with lock/alignment pins and clips located on the base of each of the transformer boat 400 and solenoid bobbin 700.

The test light 901 can be raised from the circuit board 950 by the standoff 900. The standoff 900 is preferably a two-piece snap together structure as described in applicant's co-pending patent application field on same date and incorporated herein by reference.

Elements of the current path can be attached to the circuit board at a hot attachment point and a neutral attachment point. Specifically, hot contact arm 520 and hot input terminal 550 can be soldered together and to the circuit board 950 at a location underneath the transformer boat 400. Likewise, the neutral contact arm 620 and neutral input terminal 650 can be soldered together and to the circuit board 950 at a location underneath the transformer boat 400 and adjacent to the hot attachment point. Accordingly, electrical power can be supplied to the electronic components 951 and all other electronic devices located on the circuit board 950 via the hot input terminal 550 and neutral input terminal 650.

Figure 4:
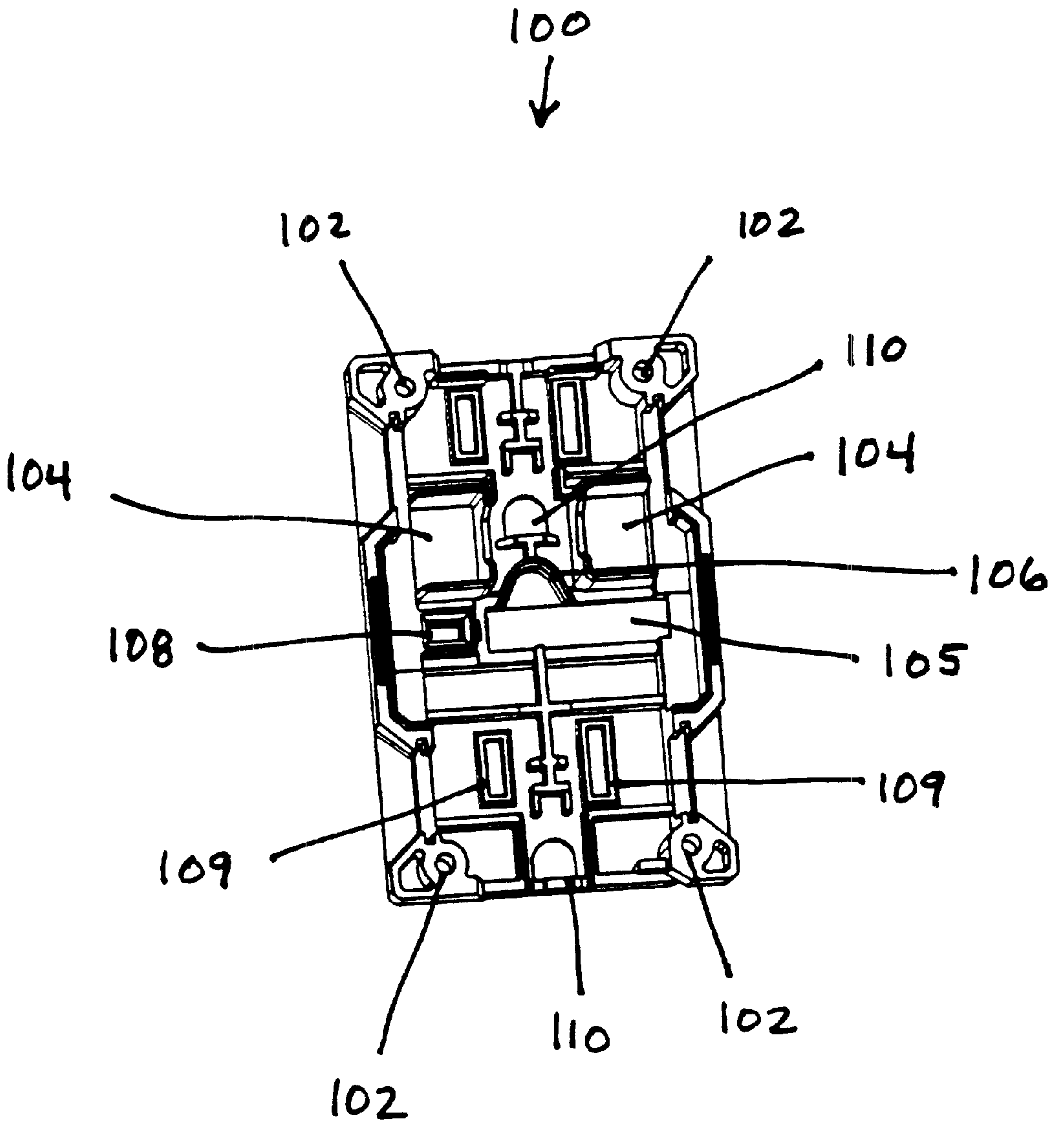
FIG. 4 is an isometric view of the back of the top housing cover as shown in FIG. 1A.

As shown in FIG. 4, the top housing cover 100 can include tapped or self tapping attachment holes 102 located at the corners of the top housing cover 100 for screw connection to the bottom housing 200. Contact cavities 104 are shown located in the central portion of the top housing cover 100 for sealing and protecting the area in which contact are located in the hot and neutral current paths. Test reset aperture 105 can be configured as a long, narrow rectangular opening in the central portion of the top housing cover 100. The test/reset aperture 105 permits the test button 801 and reset button 802 to be contactable from outside of the top housing cover 100.

A reset pin guide 106 can be formed as part of the back surface of the top housing cover 100 to stabilize and guide the motion of the reset button 802 and shaft 804 in a linear path when they are actuated.

Light aperture 108 can be located adjacent the test/reset aperture 105 for convenient viewing. The test light 901 is aided by the standoff 900 to extend from the circuit board 950 and into the light aperture 108.

Ground hole 110 and slot 109 are shown arranged in the North American standard configuration for household electrical outlets. Although not shown, other configurations for the ground hole 110 and slots 109 are well known for complying with other types of electrical plugs as appropriate in various area of the world and for various applications.

Figure 5:
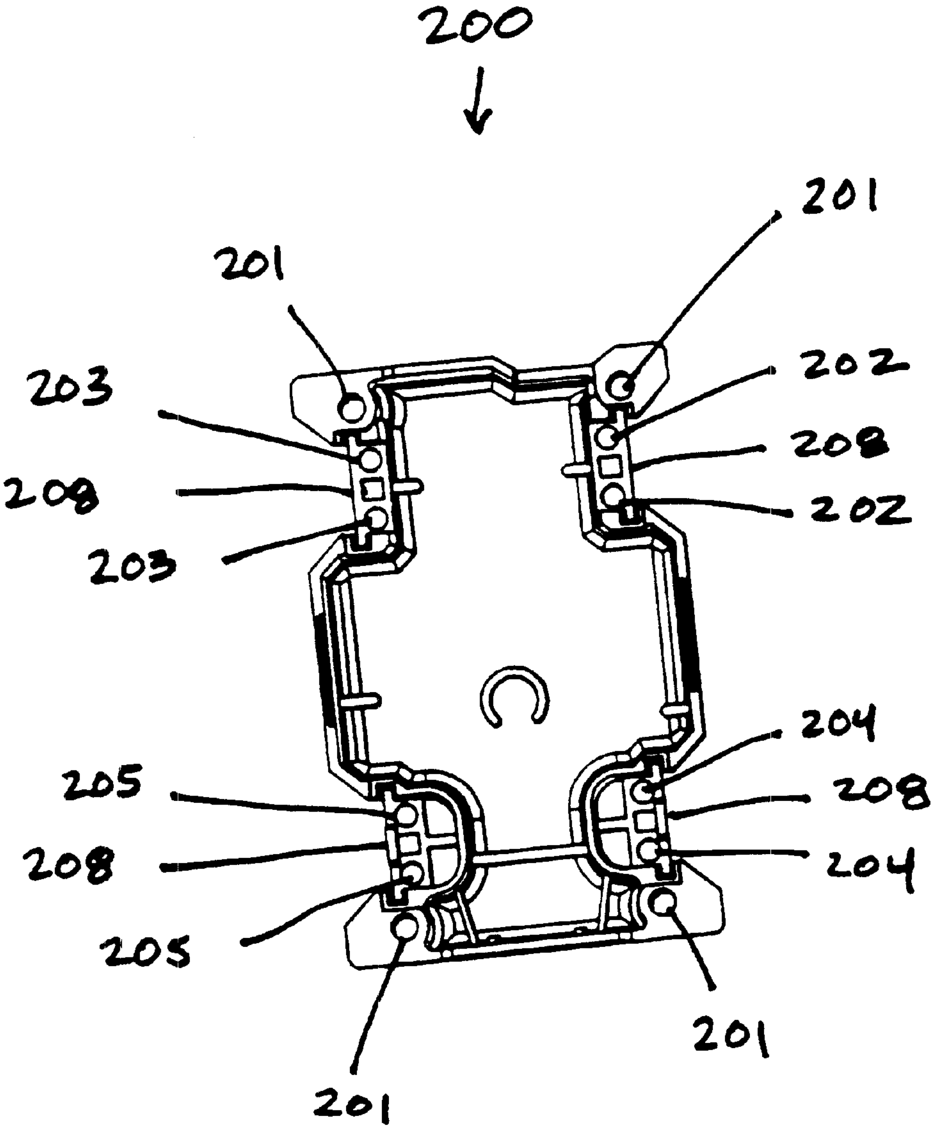
FIG. 5 is an isometric view of the back of the bottom housing cover as shown in FIG. 1B.

As shown in FIG. 5, the bottom housing 200 can be a unitary one piece structure that is generally rectangular in shape and includes connection holes 201 located at each corner. The connection holes 201 are in alignment with the attachment holes 102 in the top housing cover 100 for connecting the top and bottom housing covers 100, 200 by a screw, nail or other fastening device.

The bottom housing 200 of the GFCI device can be configured with several different input and output connection options. In particular, indents 208 can be provided at the sides of the bottom housing 200 to facilitate connection between a U-shaped connector on an input wire to a screw/face terminal connection 961 provided on one of the current pathways of the GFCI circuitry. In addition, bottom housing 200 can be provided with neutral input connection holes 202, hot input connection holes 203, neutral output connection holes 204 and hot output connection holes 205. The connection holes 202–205 permit bare electrical lines access to the GFCI circuity. Specifically, a bare wire inserted into one of the connection holes 202–205 can be guided to an area between a connection face plate 963 and its associated wire connector surface, e.g., wire connector 508, 551, 608 or 651. After insertion, the bare wire can be clamped into connection with one of the current pathways by turning a screw of a screw/face terminal to cause the connection face plate 936 to close onto and clamp the bare wire between the connection face plate 963 and a wire connector 508, 551, 608 or 651. The connection face plate 963 can include horizontal grooves therein to prevent a bare wire connected thereto from slipping out of connection with the connection face plate 963. A bare wire connection can be made alternatively or in addition to the connection of a U-shaped wire terminal to the screw/face terminals 961 located at the sides of GFCI housing.

The screw/face terminals 961 can be situated in the bottom housing 200 such that they can be connected to either a U-shaped connector on the end of a wire at indent 208 or to a bare wire that is inserted into one of the connection holes 202–205. The U-shaped wire terminal can be clamped between the screw head of the screw/face terminal 961 and the outer surface of one of the wire connectors 508, 551, 608 or 651.

Figure 6A:
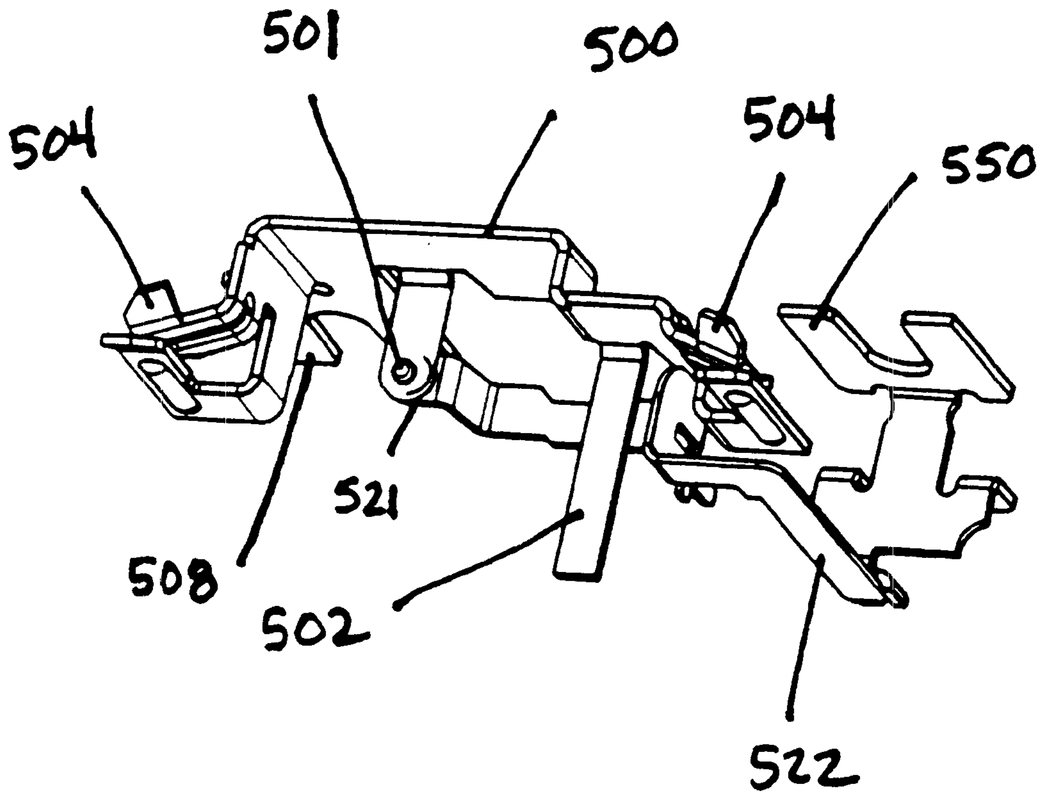
FIGS. 6A and 6B are isometric views of the hot current path and neutral current path, respectively, of the GFCI device as shown in FIG. 2.
Figure 6B:
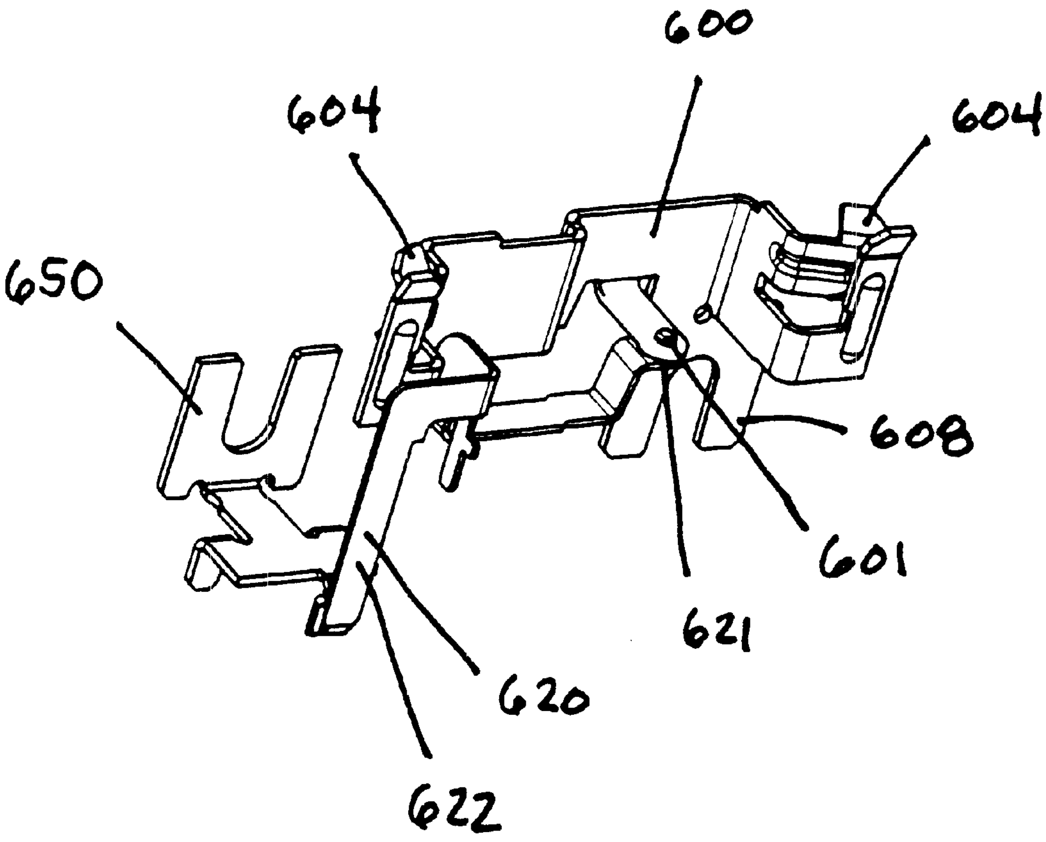

FIGS. 6A and 6B show the hot and neutral current pathway structures, respectively, of the GFCI device. FIG. 6A depicts the various structures that make up the hot current pathway for the GFCI device and shows their relative position as assembled. The hot current pathway can consist of a hot input terminal 550, a hot contact arm 520 two contacts 501 and 521 and a hot output terminal 500. The hot input terminal 550 can be configured to be attachable to an electrical wire for receiving positive (hot) current into the current pathway. The hot input terminal 550 can be attached to the hot contact arm 520 by soldering or the like. Additionally, both the hot input terminal 550 and hot contact arm 520 can be anchored to the circuit board 950 by the same solder connection that connects the two structures together. The hot contact arm 520 can be figured to include a contact stem 522 that extends through the center of a transformer coil 408 located in the transformer boat 400 when assembled. Current passing through the contact stem 522 is compared by the transformer coil 408 to the current returning through a similar contact stem 622 located on the neutral contact arm 620. In accordance with the laws of physics, an electrical current will be induced in the transformer coil 408 when there is a differential between the current flows in contact stems 522 and 622. Once a predetermined current is induced in the transformer coil 408, a ground fault will be indicated by the GFCI device and the current paths will be opened as explained later.

The hot contact arm 520 can be separably connected to the hot output terminal 500 via a pair of contacts 501, 521. Contact 521 can be located on a cantilevered arm portion the hot contact arm 520 and contact 501 can be located on a stationary arm of the hot output terminal 500. Accordingly, a downward force applied to the cantilevered arm portion will force the contact 521 out of contact with the contact 501 located on the hot terminal 500 to open the hot current pathway. The hot output terminal 500 can be separably connected to the hot contact arm 520 as explained above and can include two conventional spring type electrical receptacle contacts 504 and a wire connector 508. The wire connector 508 and receptacle contacts 504 can be connected to an outside circuit, e.g., to an appliance, other electrical device or other electrical receptacle.

As shown in FIG. 6B, the neutral current pathway structure can consist of a neutral input terminal 650, a neutral contact arm 620, a pair of contacts 601, 621 and a neutral output terminal 600. The neutral input terminal 650 can be attached to an electrical wire at one end and soldered to the circuit board 950 and the neutral contact arm 620 at the opposite end. The neutral contact arm 620 includes a contact stem 622 that can be positioned adjacent the contact stem 522 of the hot contact arm 550 and through the transformer coil 408 to allow ground fault detection as explained above. Contact 621 can be located at a distal end of a cantilevered arm portion of the contact arm 620 and contact 601 can be located on a stationary arm of the neutral output terminal. The cantilevered arm portion is configured such that contact 621 will separate from contact 601 when a downward force is applied to the cantilevered arm portion of the contact arm 620. Accordingly, the neutral current pathway can be opened by a linear downward force applied to the cantilevered arm portion. In addition, the hot contact arm 520 and neutral contact arm 620 can be located adjacent each other when assembled into the GFCI housing such that a single structure, e.g., latch block assembly 810, can provide the downward linear force necessary to simultaneously open both the hot and neutral current pathways. The neutral output terminal 600 can be separably connected to the neutral contact arm 620 at contact point 601 as explained above. The neutral output terminal 600 also includes two conventional spring type electrical receptacle contacts 604 and a wire connector 608 for connecting a neutral electrical conductor between the GFCI device and an appliance or other electrical device or receptacle.

As shown in FIGS. 7A–7D the middle housing 300 can be molded from a unitary piece of plastic and be configured to fit within and be clamped between the top housing cover 100 and bottom housing cover 200. The middle housing 300 is preferably a different color as compared with the top housing 100 and bottom housing 200 to more clearly indicate where electrical wires can be connected to the GFCI device. For example, the middle housing 300 is preferably blue while the top housing 100 and bottom housing 200 are preferably white and grey, respectively. A pair of contact arm through holes 306 can be provided in the central area of the middle housing 300 so that the far end of the cantilevered portions of the hot and neutral contact arms 520 and 620, can pass through the middle housing 300 allowing each pair of contacts 501, 521 and 601, 621 to contact each other. Thus, the middle housing 300 protects the circuit board 950 from any sparking that may occur between pairs of contacts 501, 521 and 601, 621 when they are separated from or contacted to each other.

The top portion of the middle housing 300 can be configured to align the hot output terminal 500 and the neutral output terminal 600 and to electrically separate both of these structure from each other and from the components located on the circuit board. The hot output terminal 500 and neutral output terminal 600 can be located between the top housing cover 100 and the middle housing 300 such that a conventional plug will have access to the hot output terminal 500 and neutral output terminal 600 when inserted through slots 109 in the top housing cover 100.

Figure 7A:
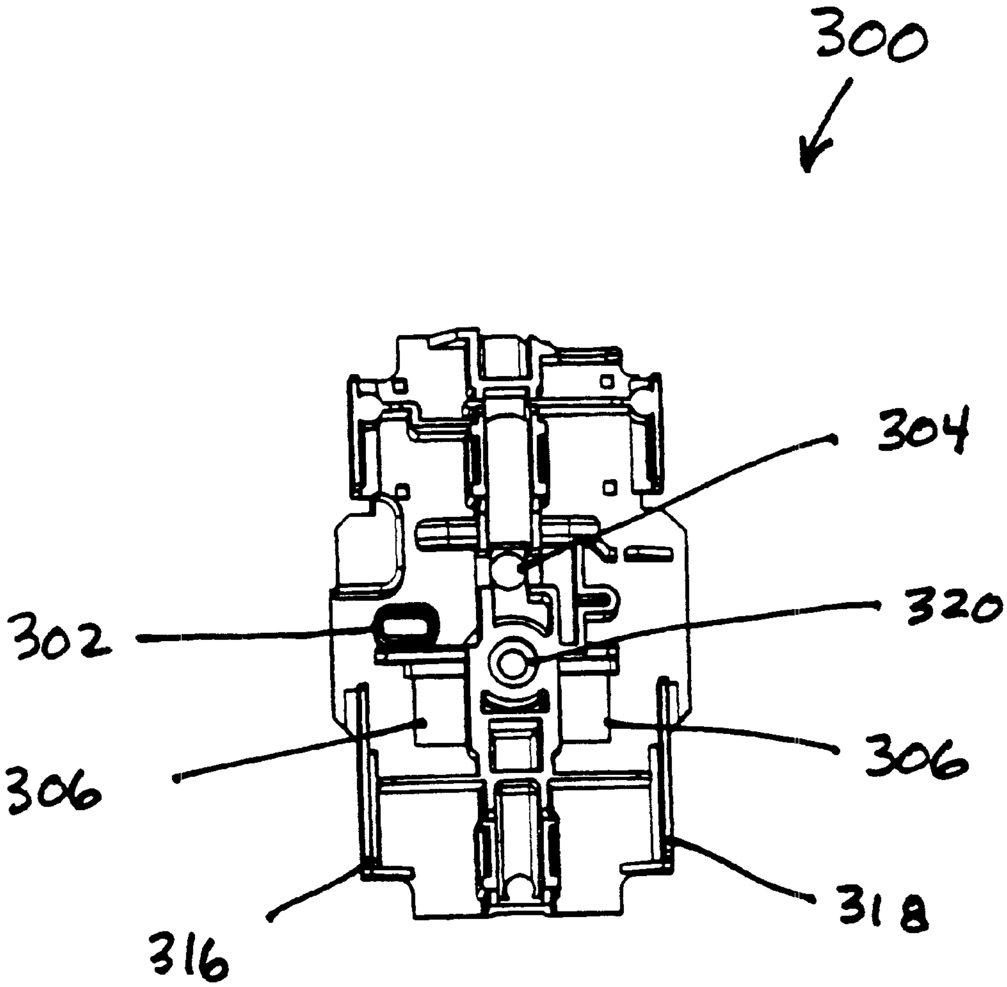
FIGS. 7A–7D are top, first isometric, bottom, and second isometric views of the middle housing as shown in FIG. 2.
Figure 7B:
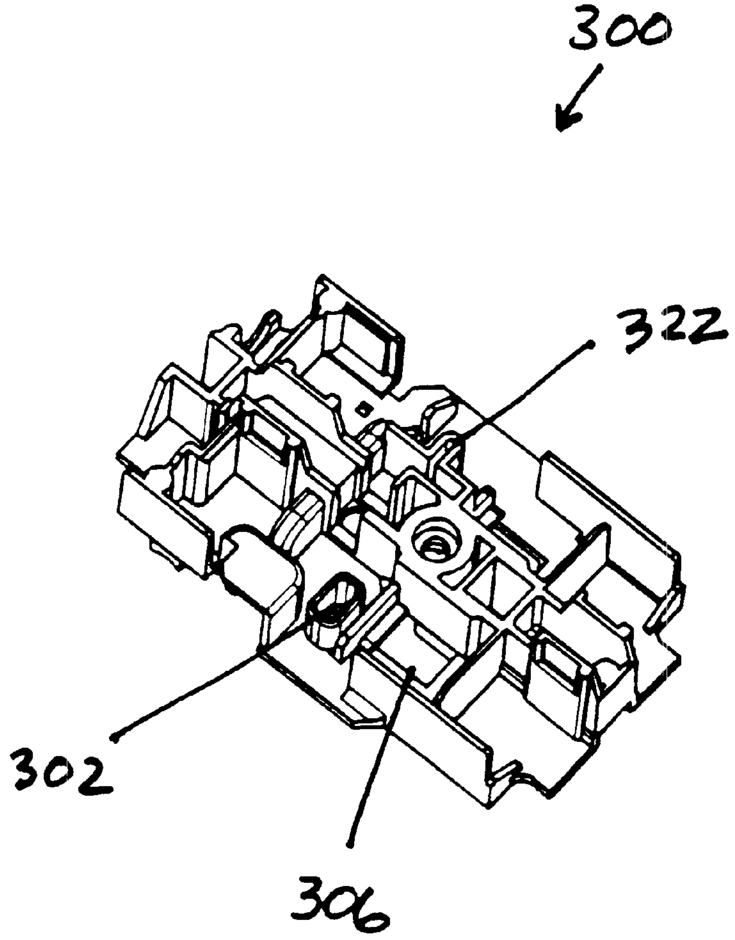
Figure 7C:
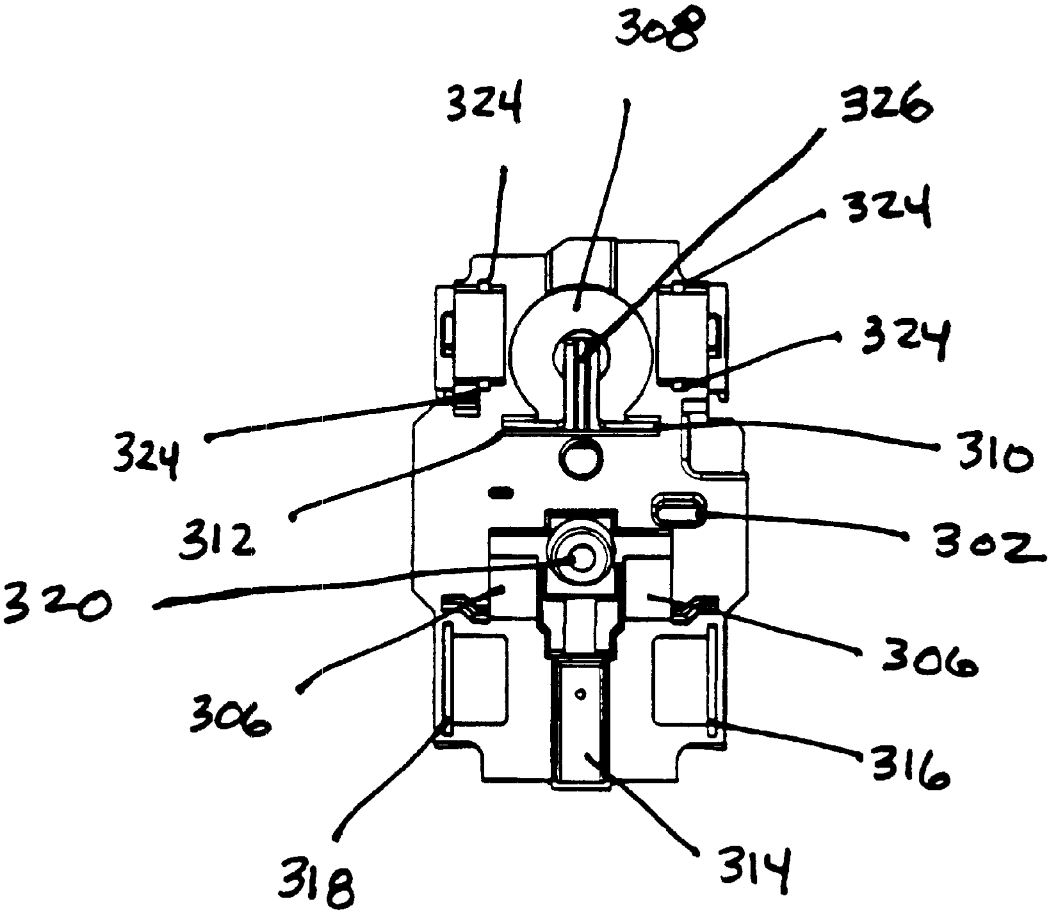
Figure 7D:
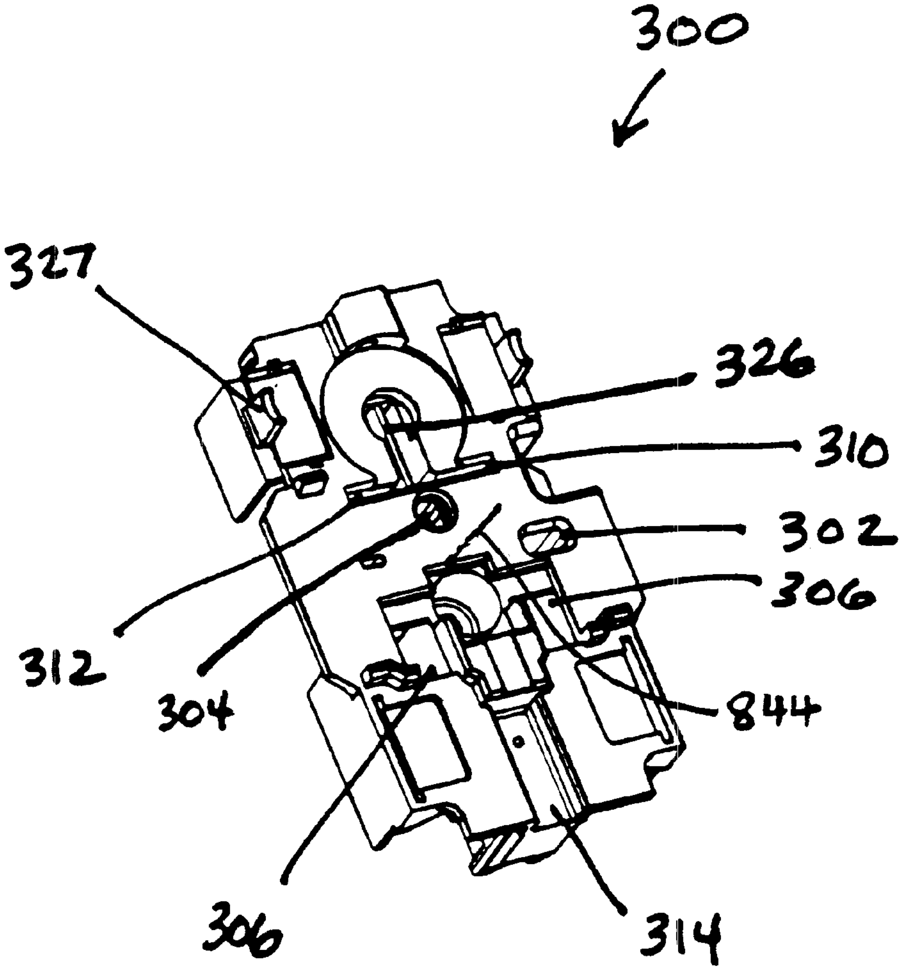

A test resistor through hole 304 in the central portion of the middle housing allows a test resistor to pass therethrough. As will be explained in more detail later, the test resistor allows the GFCI device to be tested by simulating a ground fault by diverting current through the test resistor from the hot output terminal and eventually to the neutral input terminal through the circuit board 950. A light standoff through hole 302 can be located in the middle housing 300 to support the standoff 900 as it extends from the circuit board to the top housing cover 100. Likewise, a reset shaft through hole 320 can be placed in a central area of the middle housing 300 to permit the reset shaft 804 to pass therethrough and to guide the reset shaft 804 along a linear path. In addition, the reset shaft through hole 320 includes a countersunk portion on the bottom side of the middle housing, as shown in FIGS. 7C and 7D, that allows a latch block 820 and latch block actuation spring 812 to reside therein. Accordingly, the reset shaft through hole structure guides the latch block 820 along the same linear path as taken by the reset shaft when moved.

A hot output terminal throughway 316 and a neutral output terminal throughway 318 can be located at either side of the middle housing to allow the U-shaped wire connectors 508 and 608 to pass through the middle housing 300 and be exposed at either side of the GFCI device for connection to electrical wires. A test button guide way 322 can be located in the top portion of the middle housing 300 for guiding the test button 801 along a linear path and into contact with the test switch arm 502 of the hot output terminal 500. The test button 801 can be located above and guided within the top portion of the middle housing 300 above the test resistor through hole 304.

The bottom portion of the middle housing 300 can include alignment holes 324 that mate with alignment posts 419 located on the transformer boat 400. Alignment between all of the components of the GFCI device is important to ensure that the hot and neutral contacts 501, 521 and 601, 621, respectively, remain in contact with each other when the GFCI device is in its "reset position" and to ensure that the contacts will be out of contact with each other when the GFCI device is in its "tripped position." A transformer boat indent 308 and a solenoid bobbin indent 314 can be provided in the bottom portion of the middle housing 300 to secure and align the transformer boat 400 and solenoid bobbin 700. A hot contact arm indent 310 and a neutral contact arm indent 312 can be separated from each other by a separation wall 326 to provide alignment structures for the hot and neutral contact arms 520 and 620, respectively, to reside in. The separation wall 326 also electrically insulates the contact arms 520 and 620 from each other.

Screw/face supports 327 can extend from the bottom of the middle housing 300 and into the central opening of the U-shaped wire connectors 551 and 651 located on the hot input terminal 550 and neutral input terminal 650, respectively. The screw/face supports 327 serve to retain the screw/face terminals 961 in a general area and provide support when the screw/face terminals 961 are used to lock down an electrical wire.

Figure 8A:
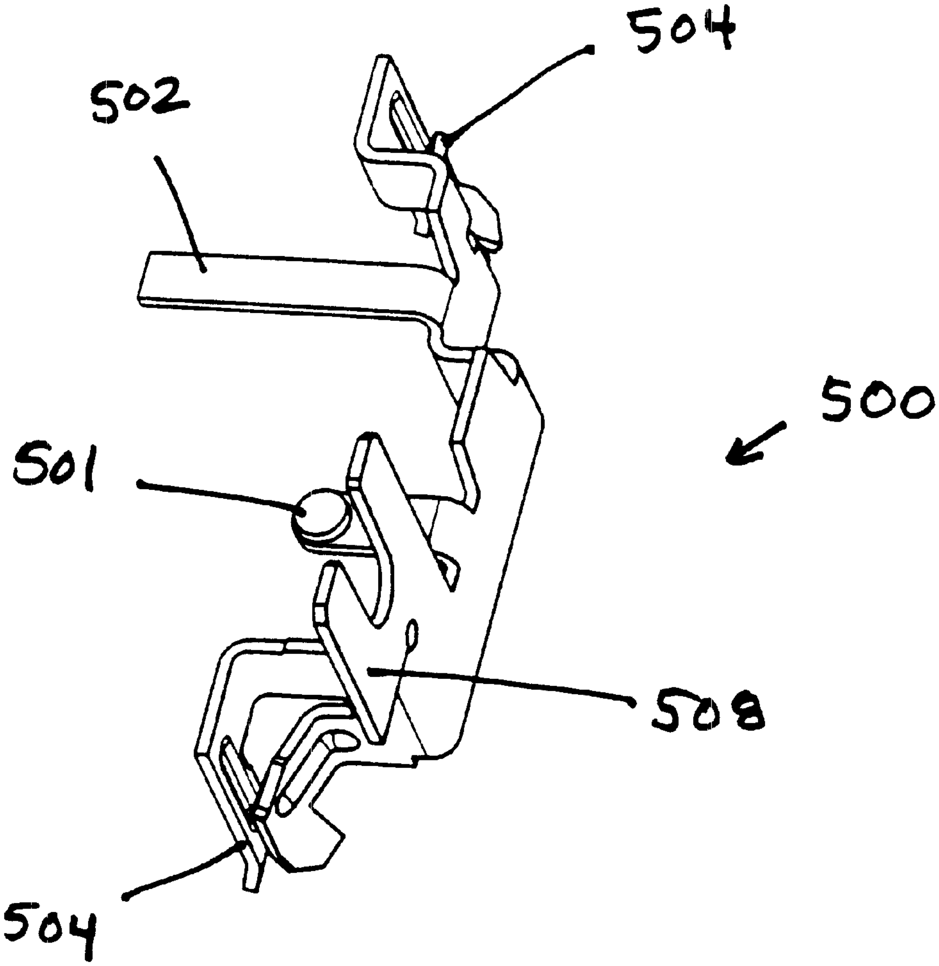
FIGS. 8A–8D are first and second isometric views of the hot output terminal and first and second isometric views of the neutral output terminal, respectively, of the GFCI device of FIG. 2.
Figure 8B:
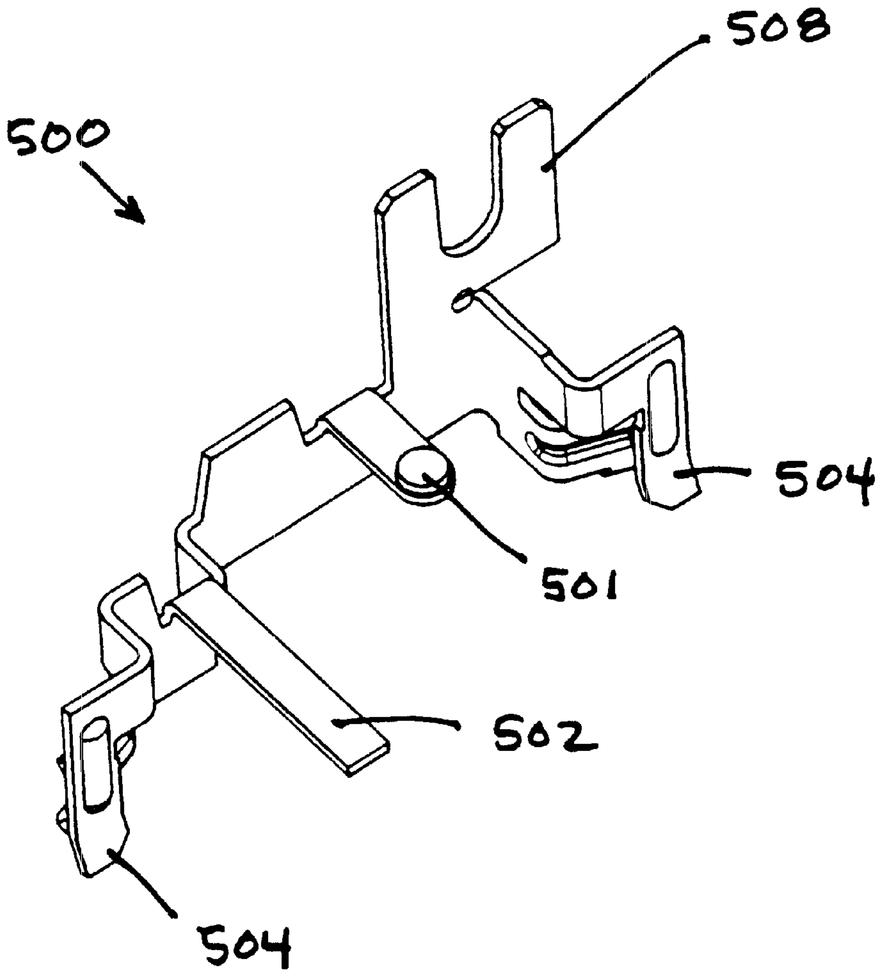
Figure 8C:
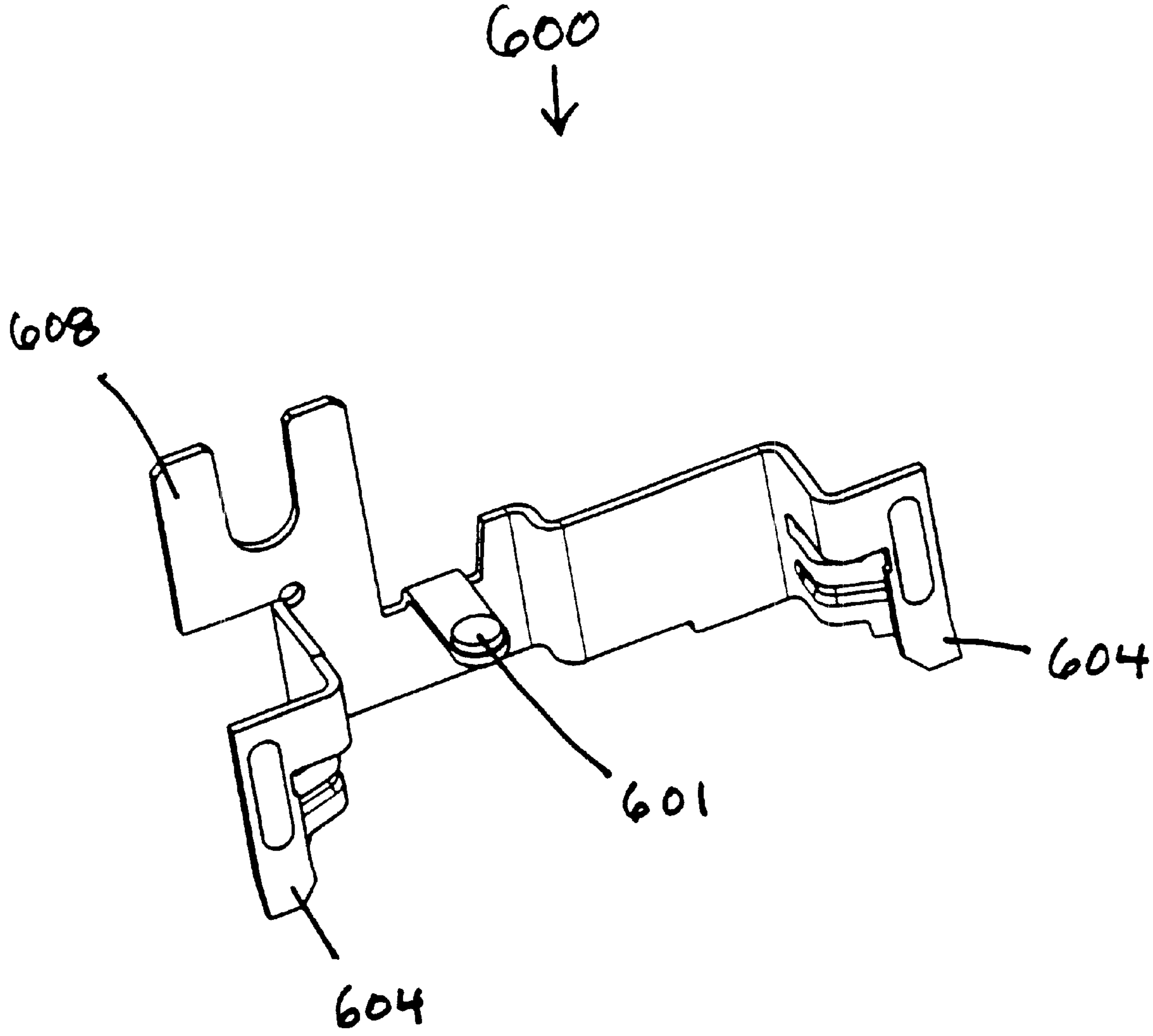
Figure 8D:
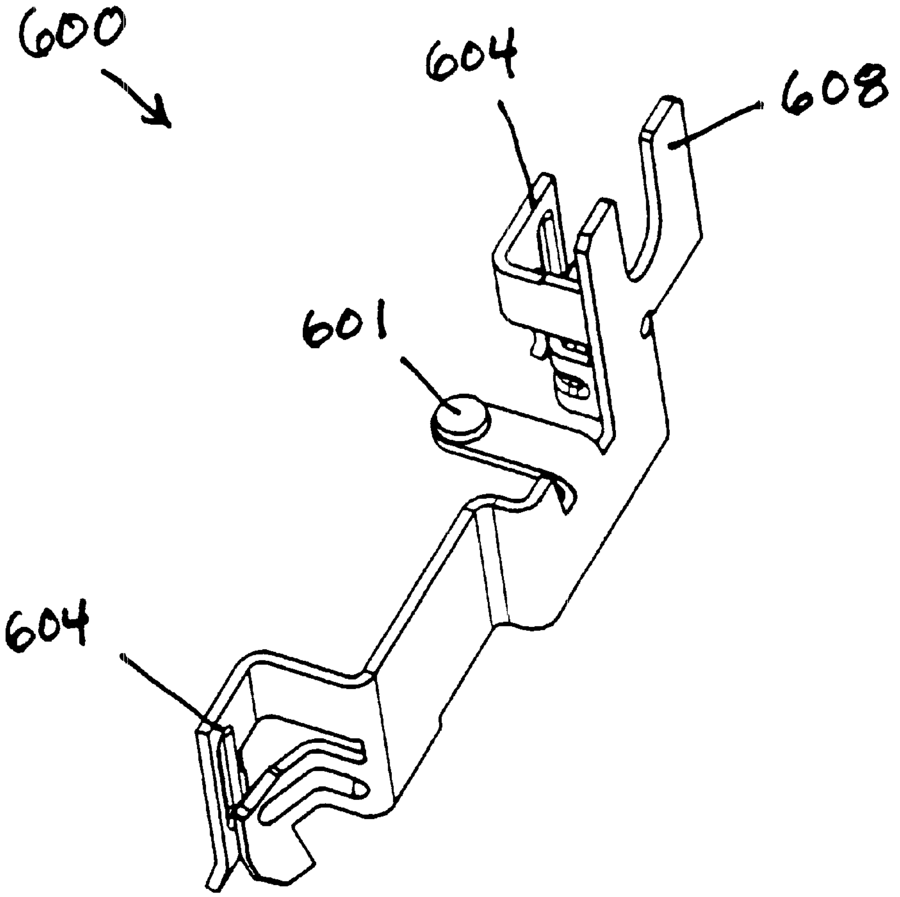

As shown in FIGS. 8A–8D, the hot output terminal 500 and neutral output terminal 600 can each be constructed as a one-piece structure that is made from an electrically conductive material such as brass. The hot output terminal 500 can include two receptacle contacts 504 that are disposed adjacent slots 109 in the top cover housing 100 when assembled. As shown in FIG. 8A, the receptacle contacts 504 are standard spring receptacle contacts that are adapted to receive a standard 120 V North American plug. However, different receptacle contacts can be used depending on the location and application of the GFCI device. U-shaped wire connector 508 extends from one end of the hot output terminal such that, when assembled, it will be located at and accessible from the side of the GFCI device for attachment to an electrical wire. A contact 501 configured for connection to a contact 521 on the hot contact arm 520 can be located on an arm that extends laterally from the hot output terminal 500. The extended arm portion of the hot output terminal 500 is relatively short and rigid such that the attached contact 501 remains stationary with respect to the hot output terminal 500 and the middle housing 300 in which the hot output terminal 500 resides.

A test switch arm 502 can be provided as an integral lateral extension from the hot output terminal 500. The test switch arm 502 can be configured to reside over the test resistor through hole 304 and under the test button 801 when assembled in the GFCI device. The test switch arm 502 is also of such a length and rigidity that depression of the test button 801 from outside the GFCI device will cause the test button 801 to contact and bend the test switch arm 502 into contact with a test resistor located in the test resistor through hole 304 of the middle housing 300. Current that flows from the hot output terminal 500 through the test switch arm 502 to the test resistor will (if the GFCI device is operating correctly) cause the GFCI device to indicate a ground fault has occurred and subsequently trip the GFCI device to open the current pathways.

The neutral output terminal 600 can also include two receptacle contacts 604 constructed in a similar fashion as are receptacle contacts 504 of the hot output terminal 500. A wire connector 608 can also be provided on the neutral terminal 600. A contact 601 can be provided on a relatively short and rigid extension arm on the neutral output terminal 600 for connection to a contact 621 located on the neutral contact arm 620.

Figure 9B:
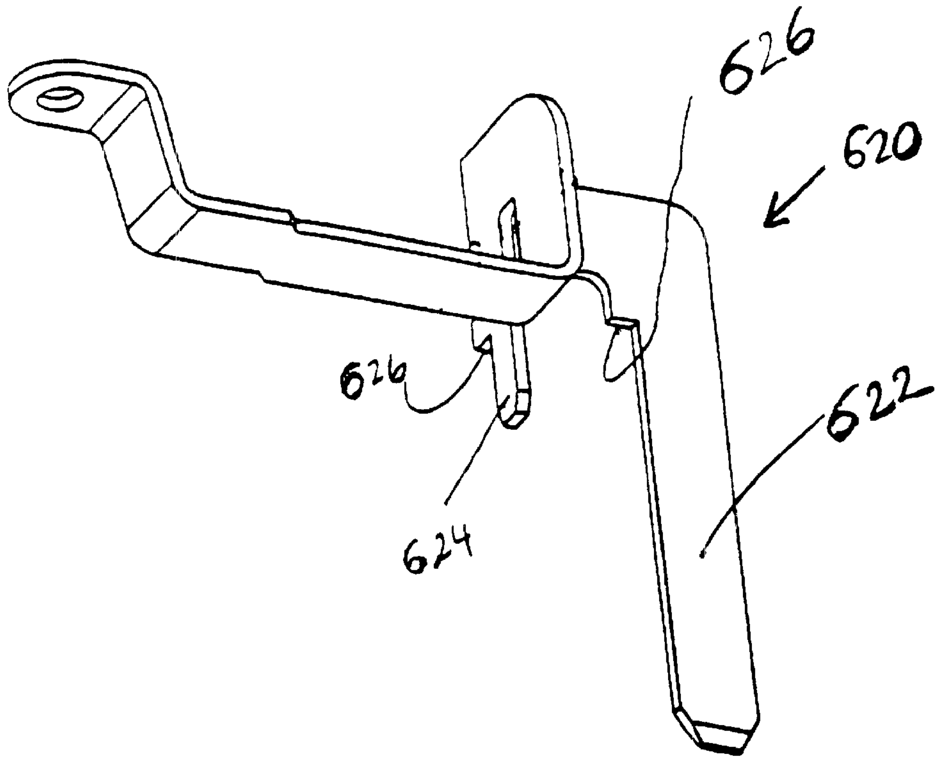
FIGS. 9A and 9B are isometric views of the hot contact arm and the neutral contact arm, respectively, of the GFCI device as shown in FIG. 2.
Figure 9A:
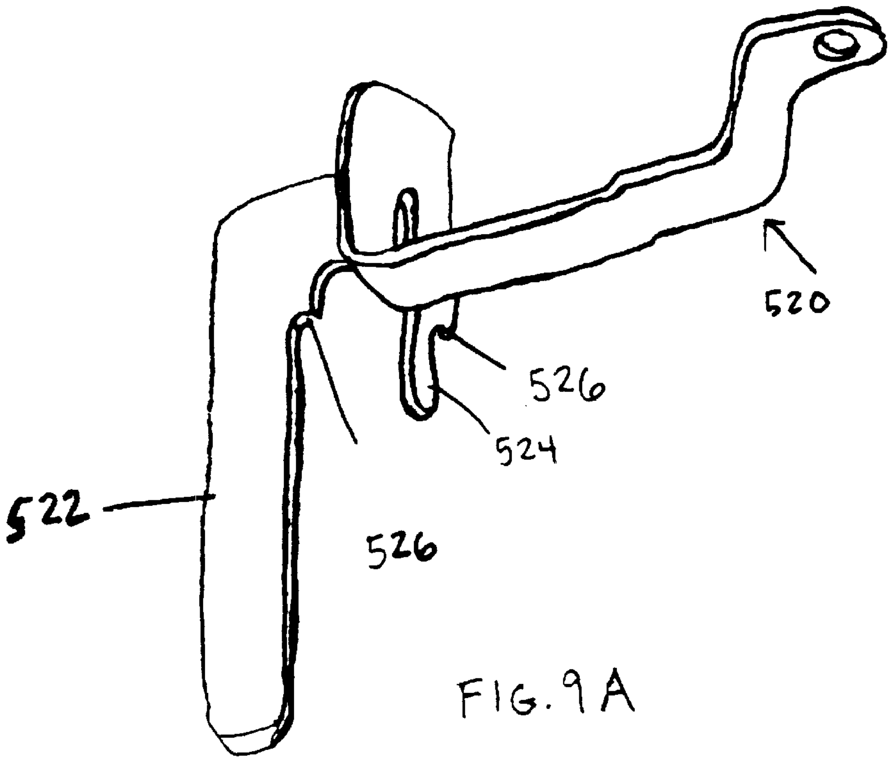
Figure 10A:
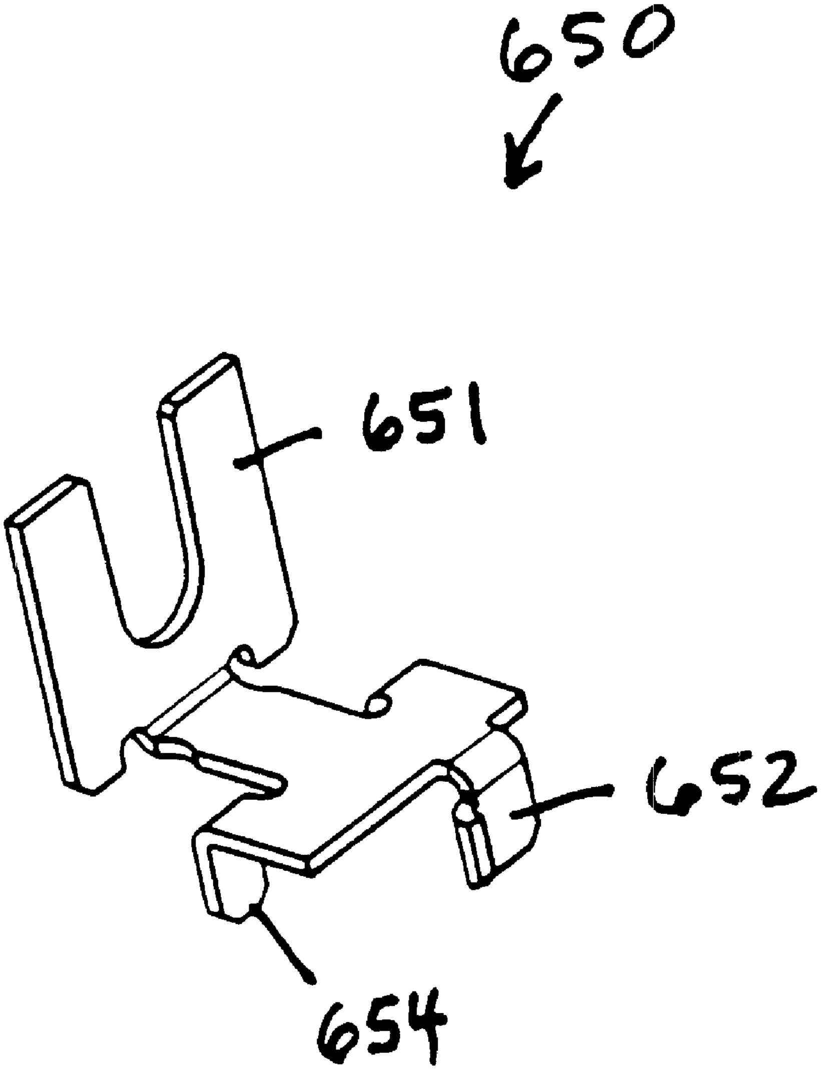
FIGS. 10A–10D are first and second perspective views of the neutral input terminal and first and second perspective views of the hot input terminal, respectively, of the GFCI device as shown in FIG. 2.
Figure 10B:
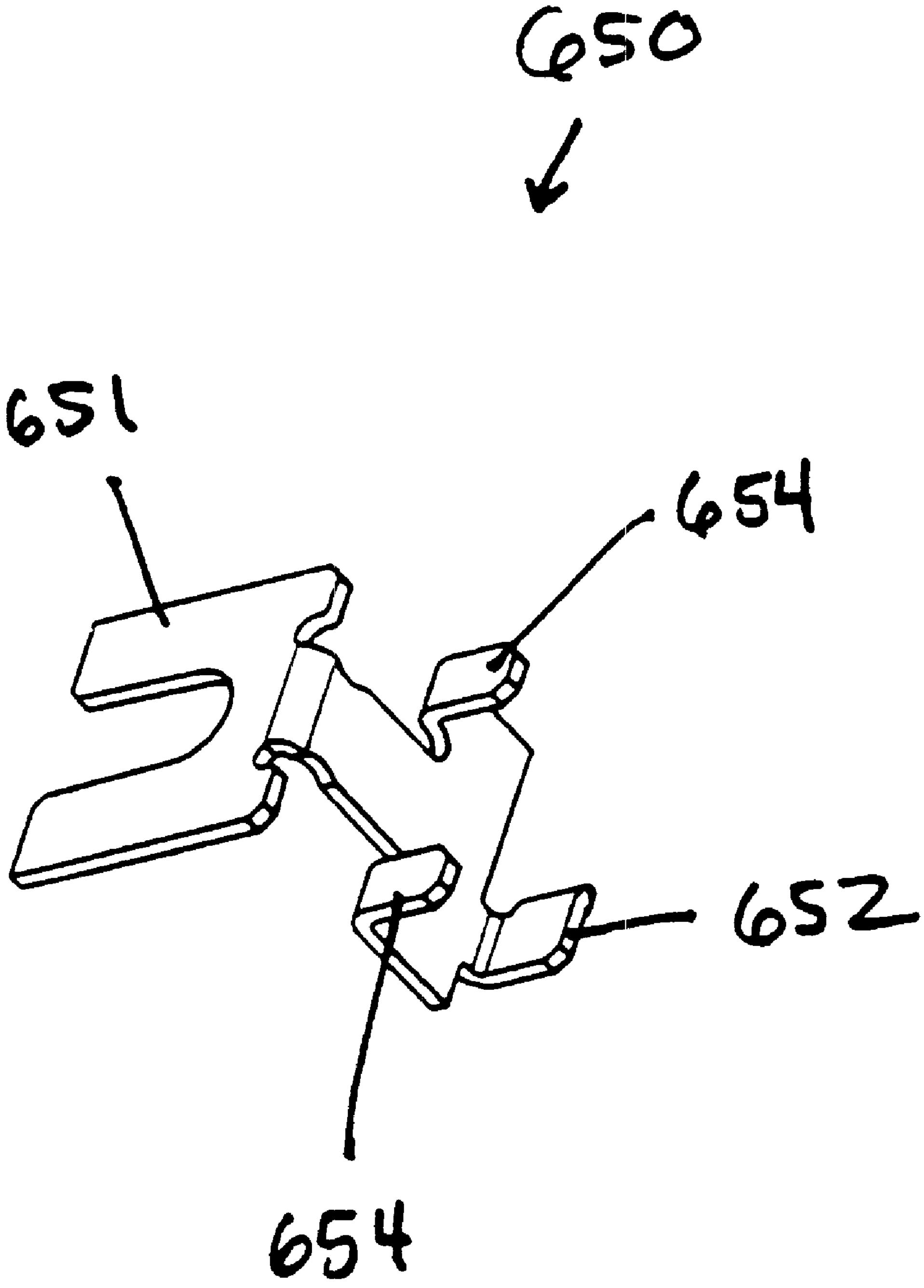
Figure 10C:
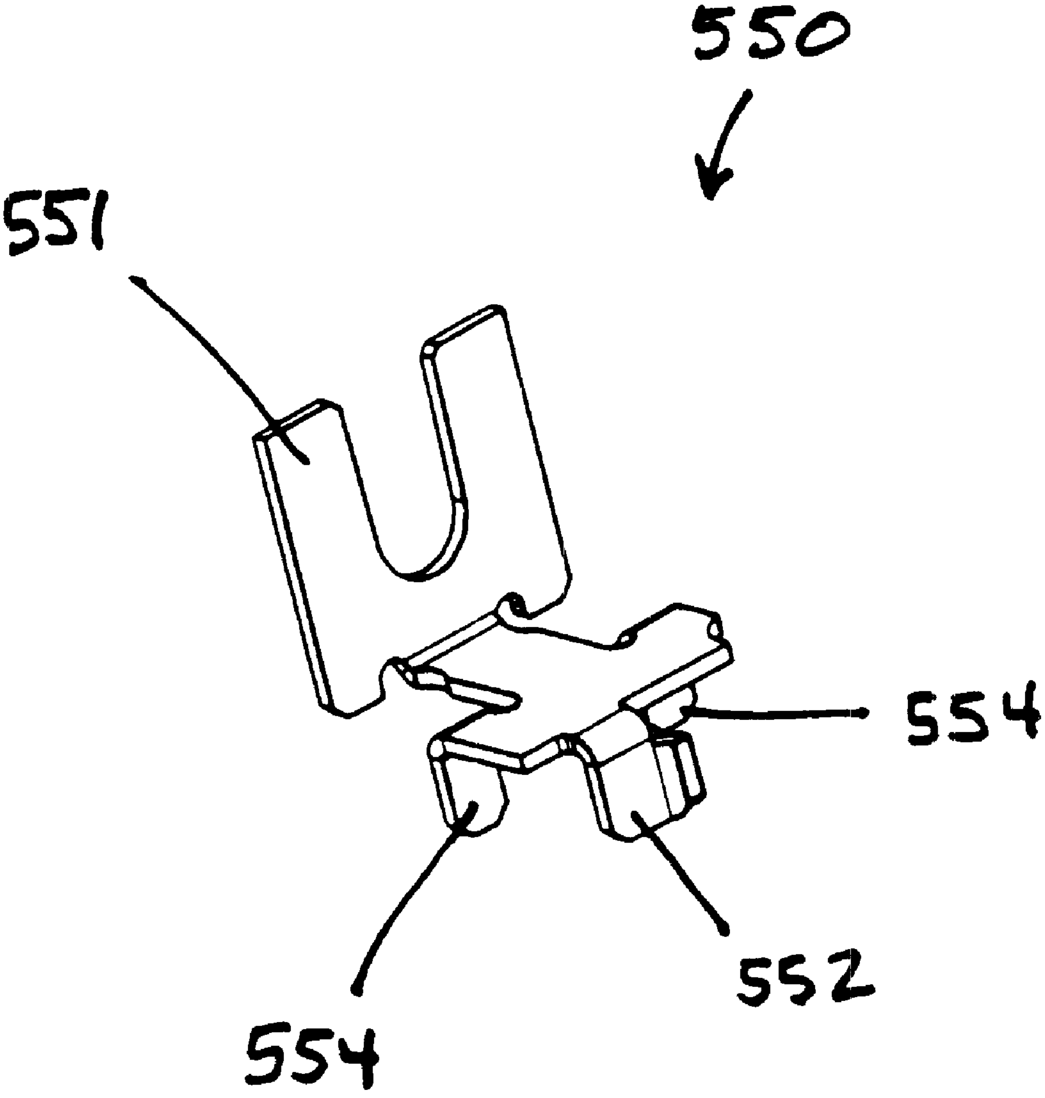
Figure 10D:
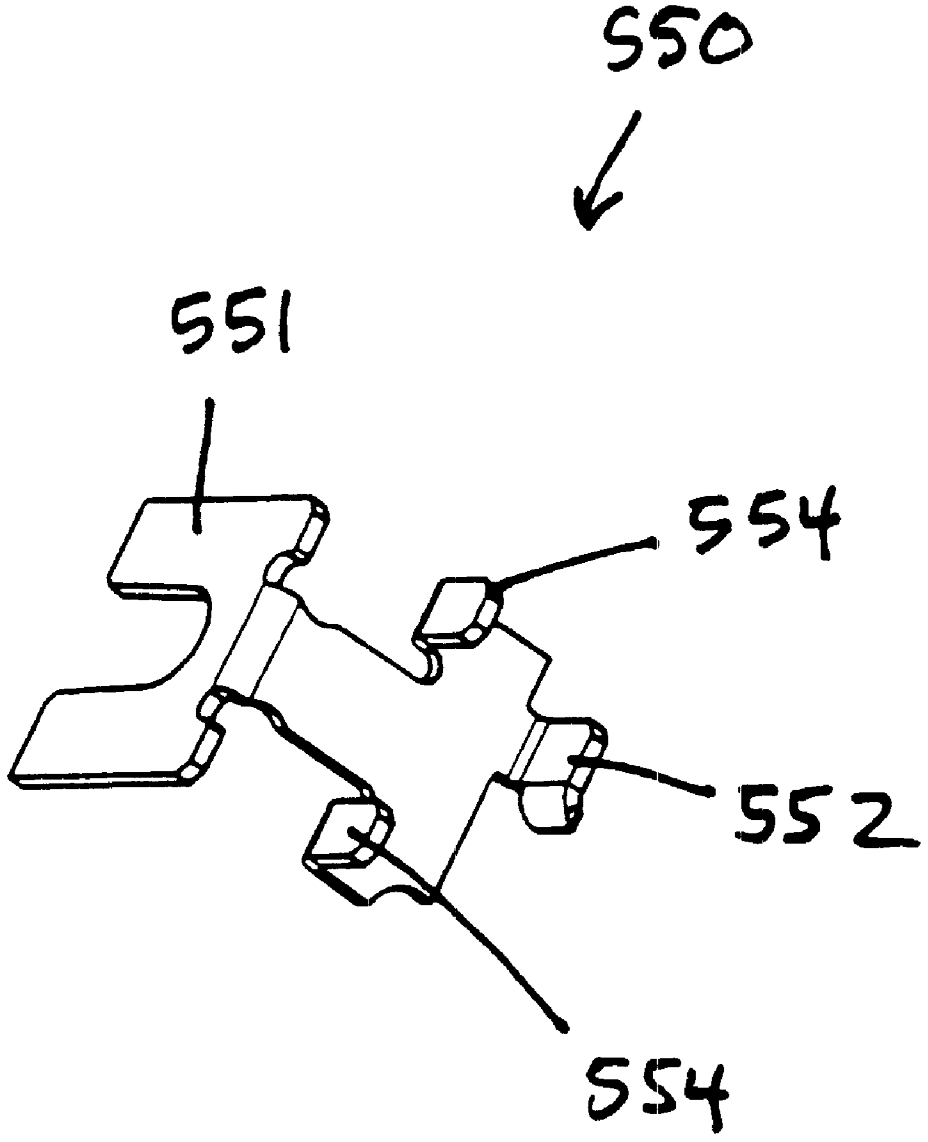

As shown in FIGS. 9A and 9B, hot contact arm 520 and neutral contact arm 620 can each be configured as a unitary structure that is basically a mirror image of each other. The hot contact arm 520 can include a contact stem 522 that is designed to extend through the center of transformer coils 408 in the transformer boat 400. A distal end of the contact stem 522 can be soldered, welded or otherwise electrically connected to both the circuit board 950 and connecting tab 552 of the hot input terminal 550. The opposite end of the contact stem 522 includes a stop tab 526 that extends from a side of the contact stem 522 for abutting against the transformer boat 400. The stop tab 526 ensures the correct insertion depth of the contact stem 522 into the circuit board and correctly aligns the hot contact arm 520 with the transformer boat 400 and GFCI circuitry. The hot contact arm 520 includes a series of bends at its middle portion to navigate around the transformer boat structure. Another stop tab 526 and an alignment post 524 can extend into transformer boat 400 and are located in the middle portion of the contact arm 520 to align the contact arm 520 within the GFCI device. A cantilevered arm portion extends from the middle portion and has a through hole at its distal end for connection to contact 521. When assembled in the GFCI device, the cantilevered arm portion extends through the middle housing such that contact 521 is normally in contact with contact 501 of the hot output terminal 500. In addition, the cantilevered arm portion is of such a length and dimension that it can be forcibly flexed about a position adjacent to the alignment post 524. Accordingly, contact 521 can be in contact with contact 501 when in the reset position and forcibly flexed away from and out of contact with contact 501 when in the tripped position. The stop tabs 526 and alignment tab 524 ensure that the contact arm 520 is positioned correctly so that the contacts 501 and 521 will be in contact and out of contact in their reset and tripped positions, respectively. In particular, alignment tab 524 is designed to extend into an alignment tab receptacle 422 in the transformer boat 400 at a depth set by stop tab 526 to secure the position of the contact arm 520 with respect to the transformer boat 400. In addition, the alignment tab 524 and stop tab 526 create an anchor point from which the cantilevered arm portion can flex.

The neutral contact arm 620 can include similar structures that perform relatively identical functions as compared to the hot contact arm 520. Moreover, neutral contact arm 620 can include stop tabs 626 and alignment tab 624 for alignment with the transformer boat 400 and for providing an anchor point for a cantilevered arm portion of the neutral contact arm 620.

Contact stem 622 is designed to extend through the transformer boat 400 adjacent to the contact stem 522 of the hot contact arm 520 and be similarly electrically attached to both the circuit board 950 and the corresponding neutral input terminal 650 at a distal end of the contact stem 622. A contact 621 can be located at a distal end of the cantilevered portion of the neutral contact arm for connection to contact 601 of the neutral output terminal when in the reset position, and for forcible separation from the contact 601 when in the tripped position.

As shown in FIGS. 10A–10D, the neutral input terminal 650 and hot input terminal 550 can each be a one-piece unitary structure made from electrically conductive material. The neutral input terminal 650 can be an approximate mirror image of the hot input terminal 550 and include a U-shaped wire connector 651, a connection tab 652 and a pair of mounting tabs 654. The mounting tabs 654 and connection tab 652 can be assembled onto the circuit board 950 such that they extend through and are soldered onto the circuit board 950. Connection tab 652 can also be soldered to the contact stem 622 of the neutral contact arm 620 such that electrical current can pass between the neutral contact arm 620 and neutral input terminal 650. The U-shaped wire connector 651 can be arranged at an approximate 90 degree angle with respect to the base of the neutral input terminal 650 so that, when installed, the wire connector 651 is located at and accessible from a side of the GFCI device. The location of the wire connector 651 provides easy connection to an electrical wire via the screw/face terminal 961.

As state above, the hot input terminal 550 can be constructed as an almost identical mirror image of the neutral input terminal 650. Specifically, the hot input terminal 550 can include a U-shaped wire connector 551 that is configured at a 90 degree angle with respect to a base portion of the hot input terminal 550. Mounting tabs 554 and connecting tab 552 can extend from the bottom of the base portion for electrical connection to the circuit board 950 via soldering or other known permanent electrical connection. The connection tab 552 can also be electrically connected to the contact stem 522 of the hot contact arm to create a current pathway therebetween.

Figure 11:
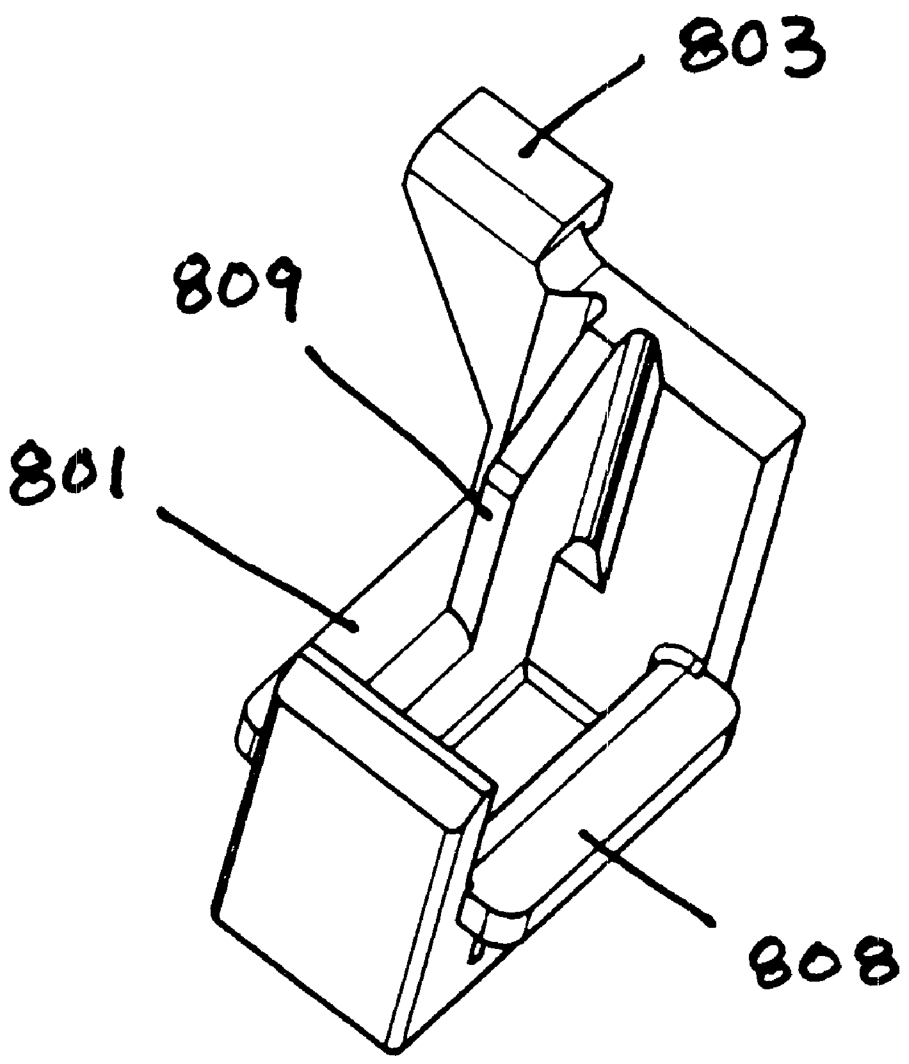
FIG. 11 is an isometric view of the test button of the GFCI device as shown in FIG. 2.

As shown in FIG. 11, test button 801 can be formed of a single-piece non-conductive material, for example, plastic. The test button 801 is design to have a push surface (as shown in FIG. 1A) that extends from the test/reset aperture 105 in the top housing cover 100. The test button 801 can be depressed by a user to cause the GFCI circuitry to simulate a ground fault detection, thereby testing whether the GFCI device is working properly. Stop flanges 808 can be located at either side of the test button 801 to abut a side of the test/reset aperture 105 and prevent the test button 801 from being removed from the top housing cover 100. A test switch arm contact surface 803 can be located below the push surface of the test button 801 and at the end of an extension supported by guide rib 809. The contact surface 803 can be designed to contact the test switch arm 502 of the hot contact arm such that the resiliency of the test switch arm 502 keeps the test button in a protruded state from the test/reset aperture 105 in the top housing cover 100. In addition, when the test button 801 is depressed, the contact surface 803 can be situated such that it forces the test switch arm 502 to flex downward and contact a test resistor located in the test resistor throughway 304 to simulate a ground fault and test whether the GFCI device is operating properly. The test button 801 can be guided along a linear path during depression by guide rib 809 acting in conjunction with the test button guide way 322 in the middle housing 300.

Figure 12A:
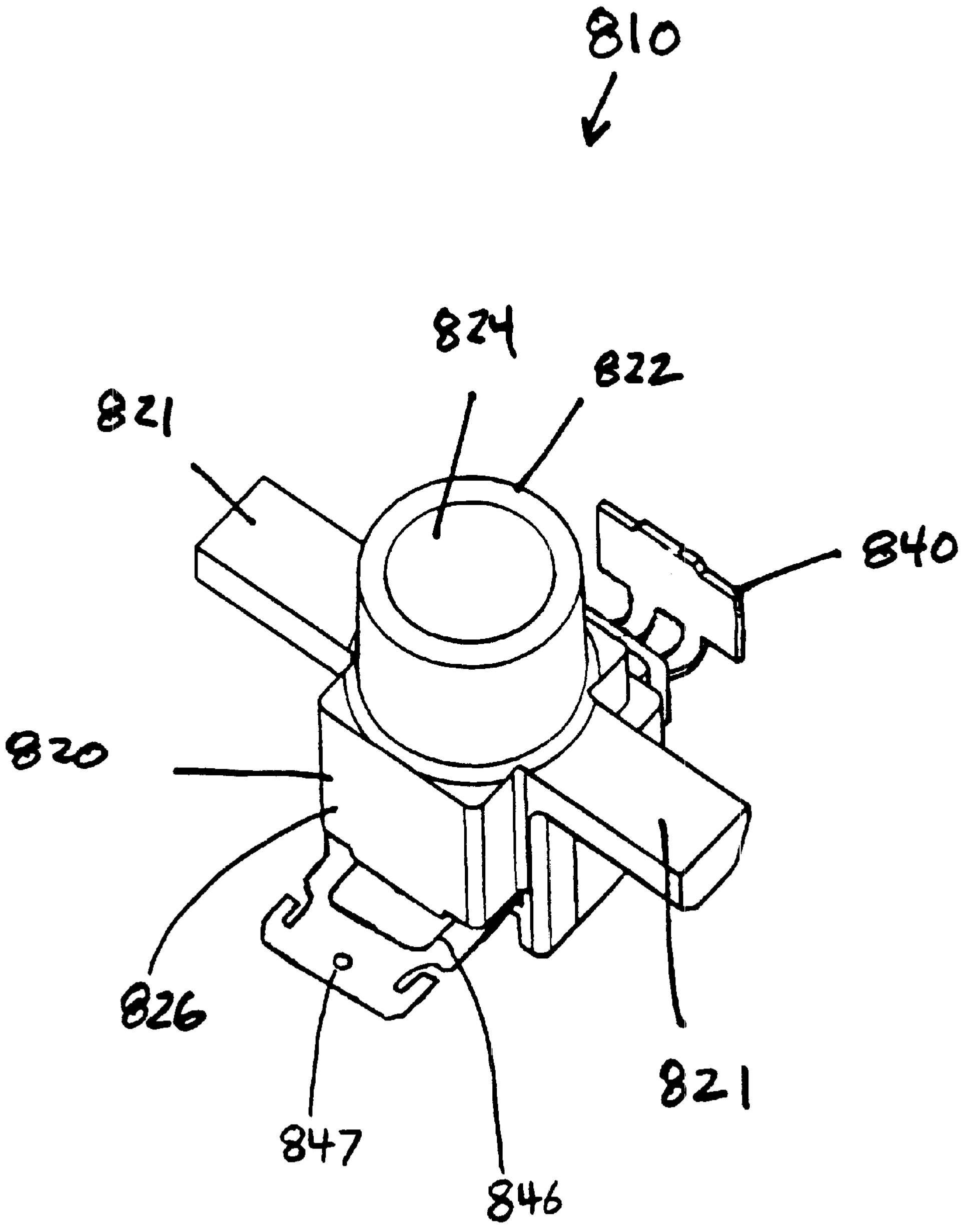
FIGS. 12A and 12B are first and second isometric views, respectively, of the latch block assembly as shown in FIG. 2.
Figure 12B:
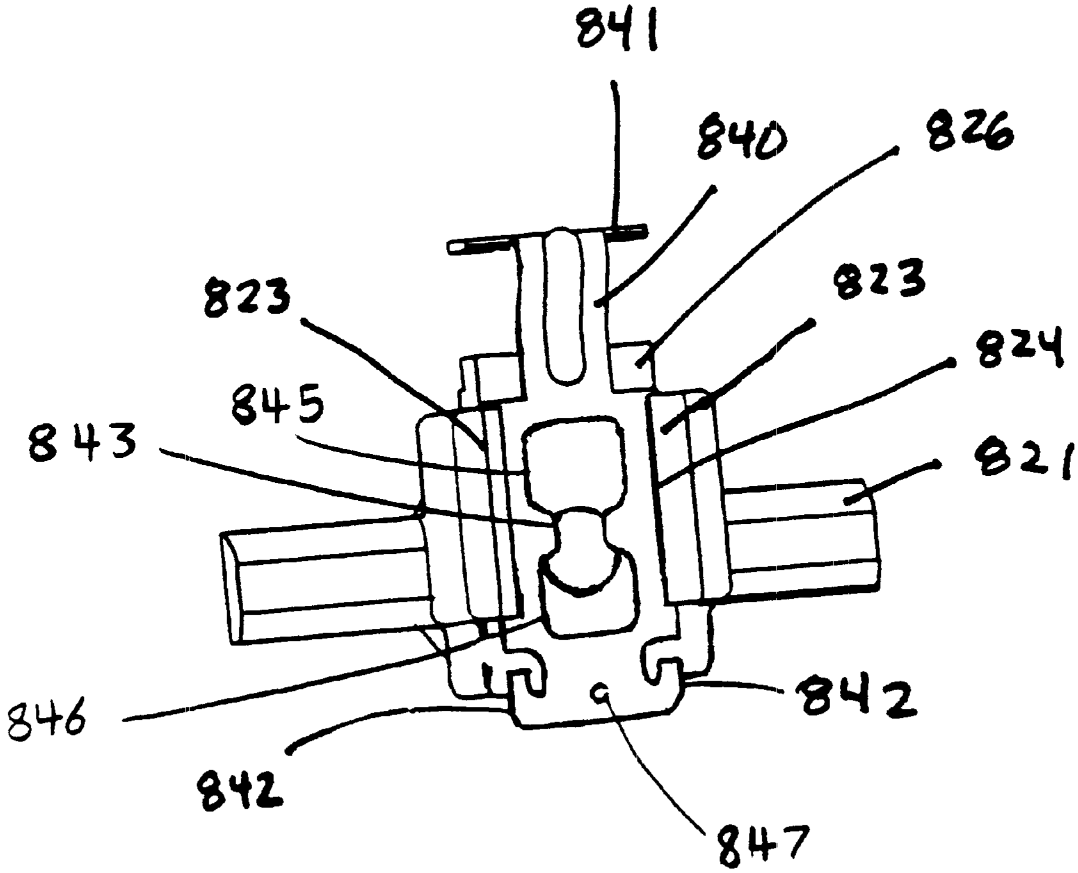
Figure 13:
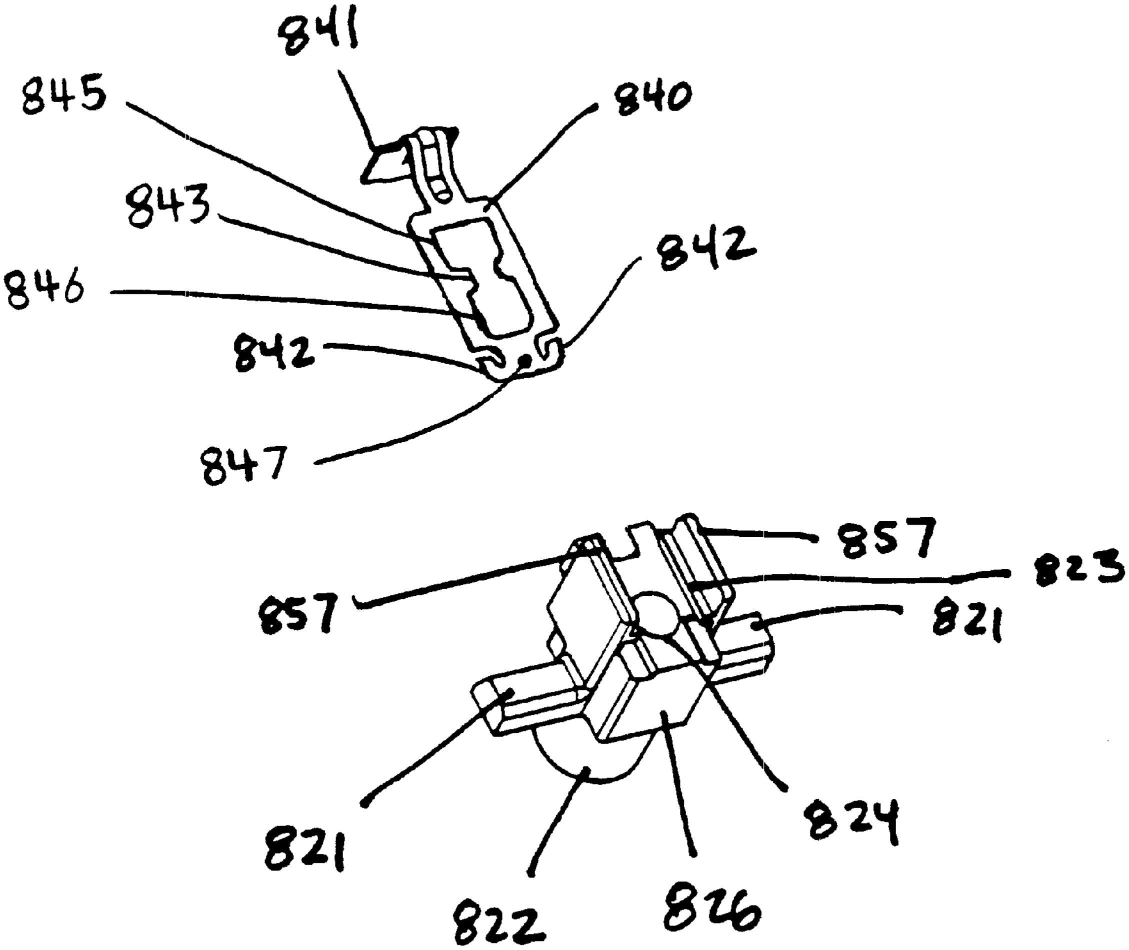
FIG. 13 is an exploded view of the latch block assembly shown in FIG. 12.

As shown in FIGS. 12A, 12B and 13, latch block assembly 810 can include two major components: a latch block 820 and a latch 840. The latch block assembly 810 works in conjunction with other elements of the GFCI device to perform various functions, including retaining the reset shaft 804 in its “reset” position, or, causing the contacts 501, 521 and contacts 601, 621 to decouple from each other to open the GFCI circuitry when a ground fault is detected or if a key electronic component malfunctions. The latch block 820 can be T-shaped with arms 821 that extend from opposite sides of a main body portion 826 and a shield tube 822 that extends from the main body portion and is located between the arms 821. A through hole 824 extends through the shield tube 822 to the opposite side of the main body portion 826. Latch guides 823 can be formed at the bottom of the latch block 820 and on either side of the through hole 824 for guiding the latch 840 along the bottom surface of the latch block 820. When assembled, an hour-glass shaped opening in the latch 840 corresponds with the through hole 824 of the latch block 824 to permit the reset shaft 804 to pass through. The shield tube 822 provides protection from the possibility of any arcing to the reset shaft 804 and/or other structures during operation.

Latch 840 can be slidably located in the latch guides 823 and includes a latch middle portion 843 for locking into latch groove 805 of the reset shaft 804 when in the reset position.

Figure 19A:
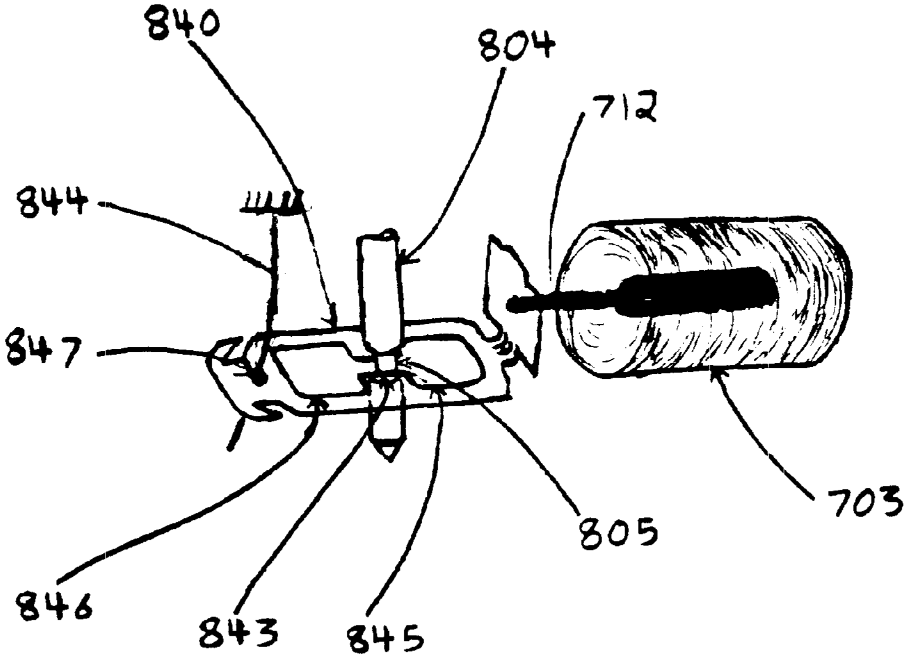
FIGS. 19A–19C are schematic views of the GFCI device in a "reset", "trip due to a ground fault" and "electronic component malfunction" state, respectively.

As shown in FIG. 12B, the latch 840 also includes two cutouts 845 and 846 adjacent to the middle portion. Cutout 845 allows reset shaft 804 to be activated in the event of a ground fault. Cutout 846 allows reset shaft to be activated if any of the key electrical components of the GFCI malfunction. As shown in FIG. 19A, the latch middle portion 843 is maintained in the latch groove 805 of the reset shaft 804 by means of the solenoid armature 712. The solenoid armature 712, which contacts the strike plate 841 of the latch 840 at end 713, maintains latch middle portion 843 at a predetermined position in latch groove 805 of reset shaft 804, against the bias of hairspring 844, which is maintained in hole 847 of latch 840. The latch 840 can include a pair of catch tabs 842 located on either side of an end of the latch 840 opposite the striking plate 841. Catch tabs 842 are bent slightly downward such that they can pass through latch guides 823 during assembly and then spring outward after assembly to prevent removal of the latch 840 as a result of contact between catch tabs 842 and either the latch block 820 or the latch guides 823.

As will be discussed in detail later, the latch block assembly 810 is slidably mounted on the reset shaft 804 such that a latch block actuation spring 812 (shown in FIG. 18) can cause the latch block assembly to slide down the reset shaft to disengage contacts 501, 521 and 601, 621 and thus open the GFCI circuitry current pathways when a ground fault is detected.

Figure 14A:
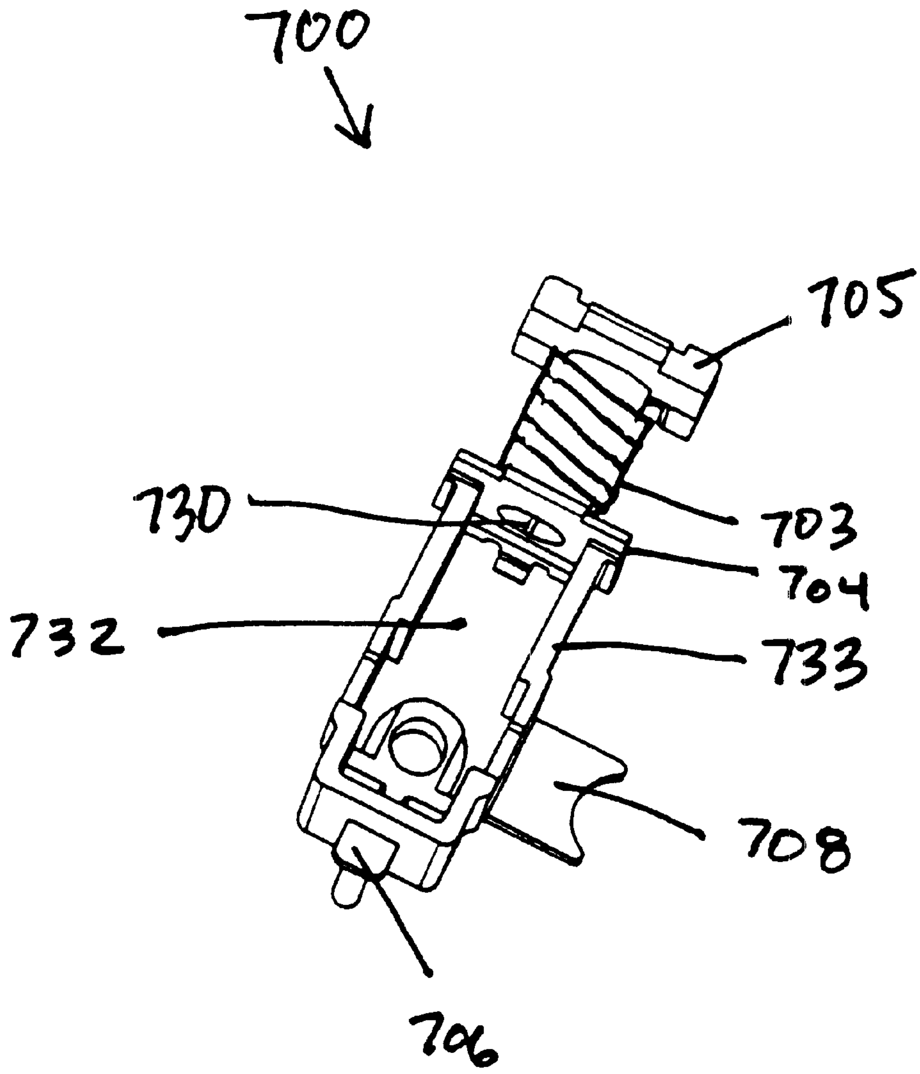
FIGS. 14A and 14B are first and second isometric views, respectively, of the solenoid and solenoid bobbin as shown in FIG. 2.
Figure 14B:
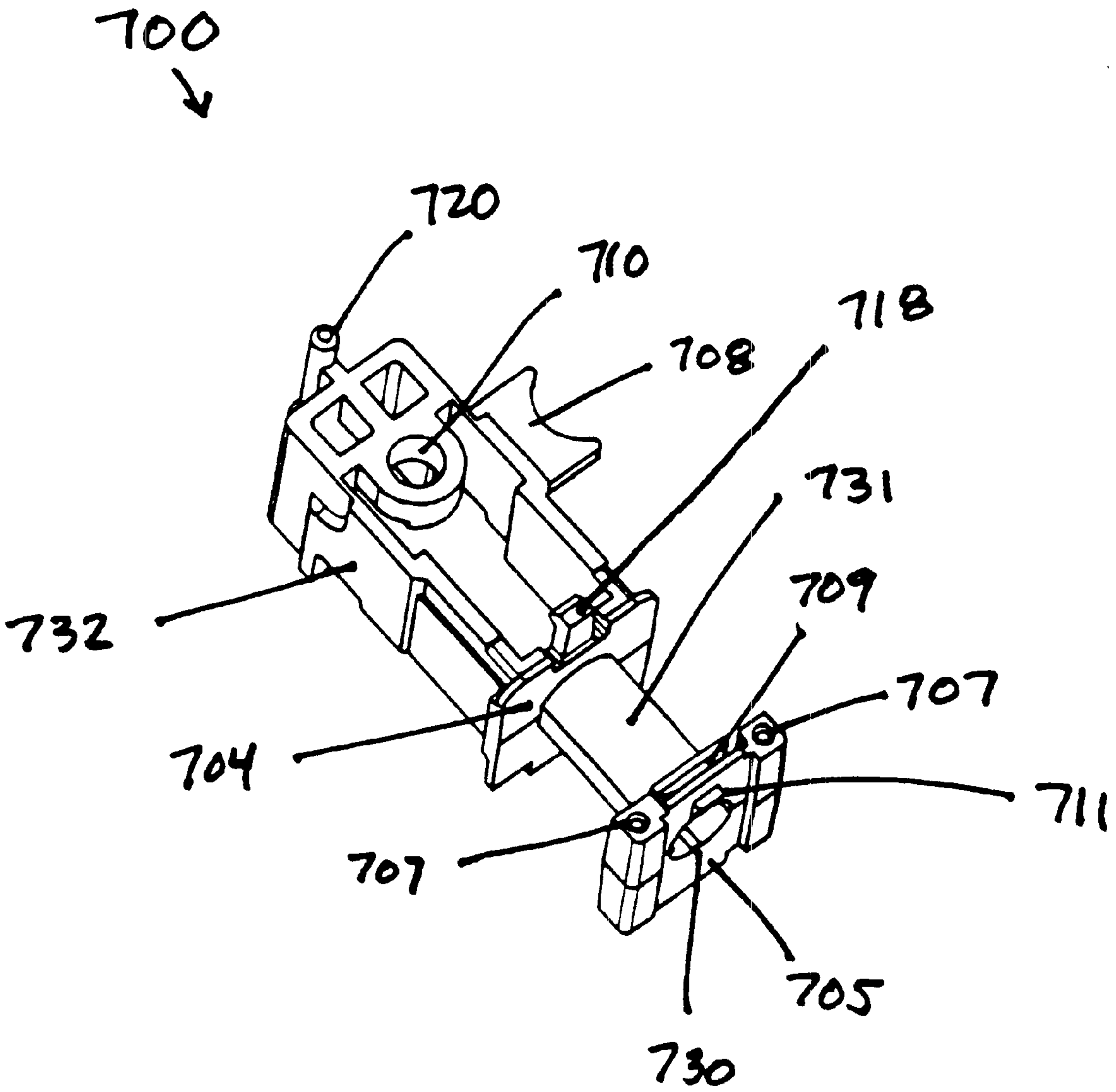

As shown in FIGS. 14A–14B, solenoid bobbin 700 can include a solenoid frame 733, solenoid winding 703 and solenoid armature 712 (as shown in FIG. 2). Solenoid winding 703 can be wound on a spool 731 located between solenoid end plates 704 and 705. The solenoid functions to trip the latch 840 of the latch block assembly 810 when a ground fault is detected, such that latch groove 805 of the reset shaft 804 is released from the middle portion 843 of latch 840, by means of the solenoid armature 712. Once the latch 840 releases the reset shaft 804, the latch block actuation spring 812 forces the latch block assembly 810 to slide along the reset shaft 804 and eventually contact the cantilevered portion of the hot and neutral contact arms 520 and 620. Accordingly, contacts 501, 521 and 601, 621 are caused to separate from each other, and the current pathways are thus opened by the downward sliding motion of the latch block assembly 810 when a ground fault is detected.

The solenoid bobbin 700 can include a one-piece solenoid frame 733 that is preferably made from a plastic material. A spool 731 with end-plates 704 and 705 bordering the spool 731 can be located at one end of the frame 733. A rectangular window portion 732 can be located at the opposite end of the solenoid frame 733. The rectangular window 732 can include a reset shaft throughway 710 for guiding the reset shaft 804 when it is depressed to reset the latch block assembly 810 to its reset position. A component support 708 preferably extends from a side of the rectangular window portion 732 for providing support for and protecting an electrical component 951 extending from the circuit board 950. A shelf 706 can be located at a distal end of the rectangular window portion 732. Shelf 706 is designed to mate with a support arm 404 located on the transformer boat 400 and cooperate therewith to provide added support to the circuit board 950 and transformer boat 400. Specifically, shelf 706 resides under and is in overlapping contact with the support arm 404 such that when the circuit board 950 is flexed or bent at a location between the transformer boat 400 and solenoid bobbin 700, the shelf 706 and support arm 400 prevent substantial movement of the circuit board 950 in the flexing or bending directions. In addition, contact between support arm 404 and shelf 706 provides reliable support to test resistor throughway 402 to ensure correct positioning of the throughway 402 and test resistor.

The solenoid bobbin 700 can be attached to the circuit board by a pivot and clip mechanism in which an alignment extrusion 720 that extends from the base of the shelf 706 is placed within a pivot aperture 953 in the circuit board 950. The solenoid bobbin 700 can then be pivoted downward about the alignment extrusion 720 to lock a snap-in lock hook 718 into a clip aperture 952 in the circuit board 950. The snap-in lock hook 718 can be located on the end of the rectangular window portion 732 opposite the alignment extrusion 720. In addition, the snap-in lock hook 718 can be constructed to flex upon entry into the clip aperture 952 and then return to its original configuration once the hook portion of the snap-in lock hook 718 has passed through the clip aperture 952. Thus, the snap-in lock hook 718 permanently attaches the solenoid bobbin 700 in place on the circuit board 950.

The spool portion 731 of the solenoid bobbin 700 includes a wire relief slot 709 for protecting the initial starting portion of wire of the solenoid winding from being damaged by the winding process. An armature throughway 719 can extend through the spool 731 and open into the rectangular window portion 732. The armature throughway 719 preferably includes guidance/friction reducing ribs 730 that guide and facilitate easy movement of a solenoid armature 712 located within the armature throughway 719. The armature 712 is preferably a metallic cylinder shaped structure that includes an armature tip 713 at one end. The armature tip 713 can be configured to contact the striking plate 841 of the latch 840 whenever the armature 712 is propelled by the energized solenoid winding 703.

First and second terminal holes 707 can be located on the bottom corners of end plate 705 for connection to the circuit board 950. The first and second end of the wire that forms the solenoid winding 703 can be attached to first and second terminal pins that extend into terminal holes 707 from the circuit board to supply electrical power from the circuit board 950 to the solenoid. Upon receiving power from the circuit board, the magnetic field created by solenoid winding 703 forces the solenoid armature 712 towards striking plate 841 of the latch 840 to move the latch against the bias of hairspring 844.

Figure 15A:
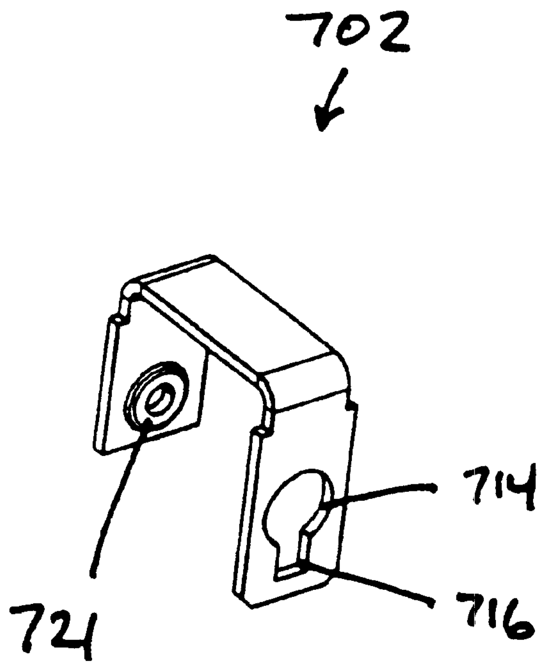
FIGS. 15A and 15B are first and second isometric views, respectively, of the solenoid clip as shown in FIG. 2.
Figure 15B:
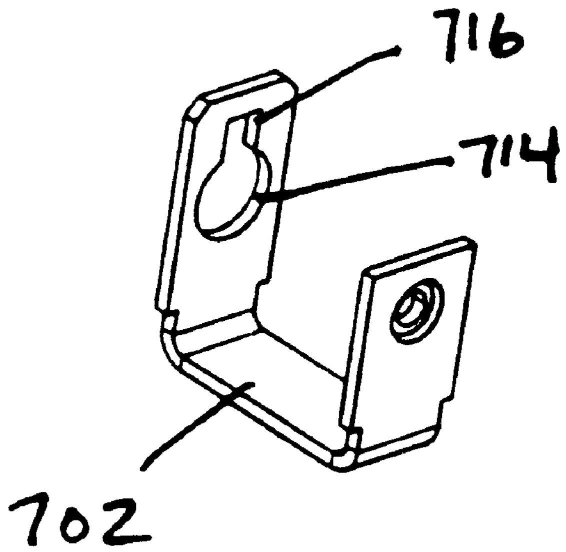

As shown in FIGS. 15A and 15B, a solenoid bracket 702 can be a single-piece structure that includes two arms extending from a base to form a U-shaped bracket. An alignment dimple 721 can be provided on the inside surface of one of said arms to align the bracket within the armature throughway 719 of the solenoid frame 733. A throughway is provided at the center of the dimple to permit the armature tip 713 to pass through when actuated and contact the striking plate 841. An armature throughway 714 can extend through the other of said arms of the solenoid bracket 702 to permit the armature 712 to pass therethrough. The armature throughway 714 can include a key notch 716 that rides over and locks onto a locking ramp 711 in the solenoid end plate 705.

Figure 16A:
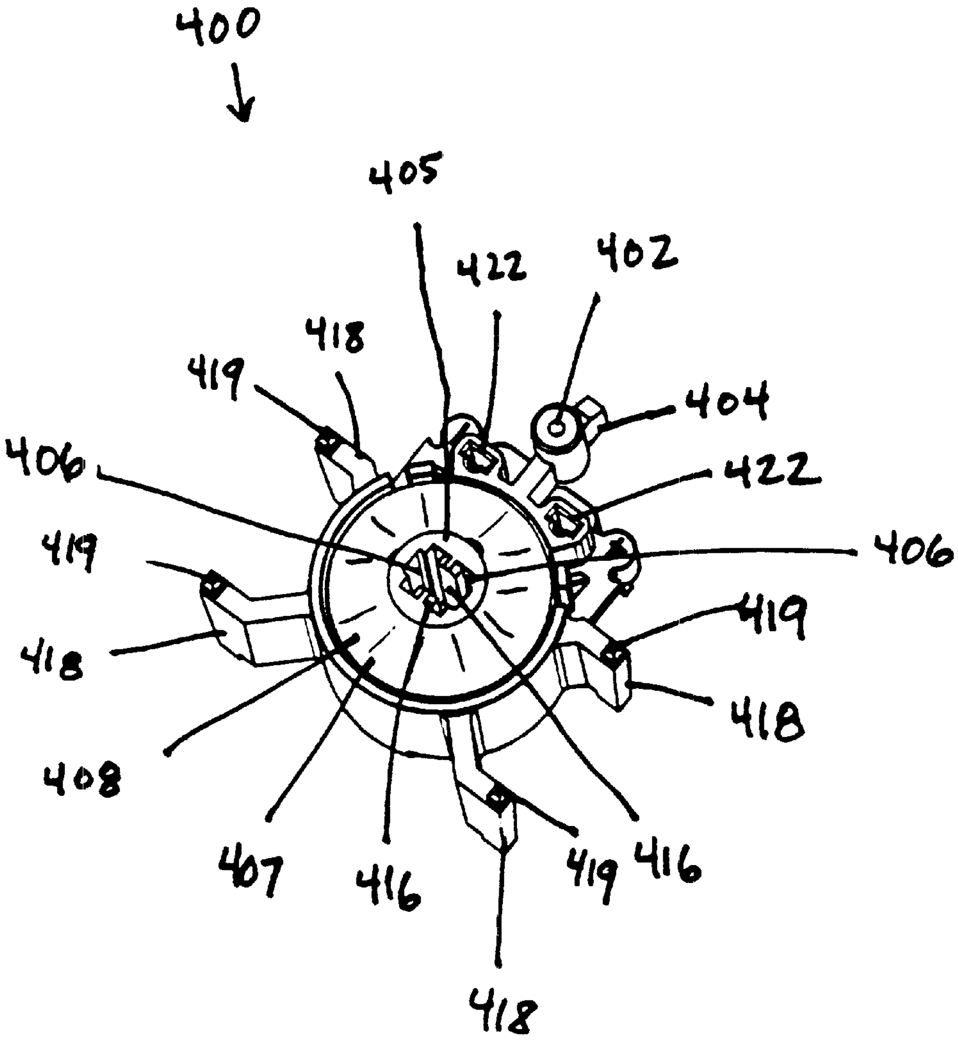
FIGS. 16A and 16B are first and second isometric views, respectively, of the transformer boat as shown in FIG. 2.
Figure 16B:
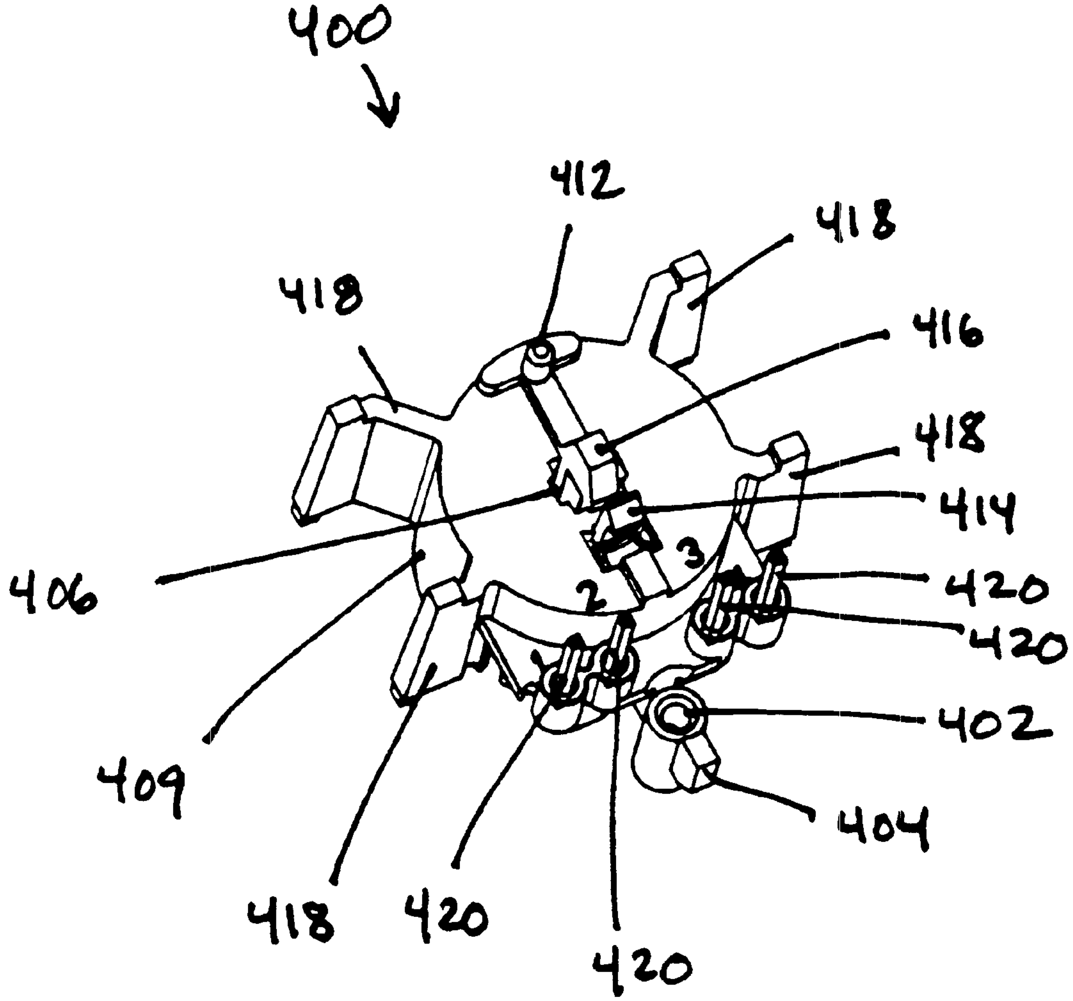

As shown in FIGS. 16A and 16B, the transformer boat 400 can be a relatively cylindrical object having a plurality of arms 418 extending from the sides of the cylindrical structure. The transformer boat 400 can include a pair of transformer coils 408 that are separated by a first insulating washer 407 and covered by a second identical insulating washer 407. Insulating washers 407 can be provided with indents around its inner diameter that allow the washer to easily flex over and lock onto the inner cylindrical portion 405. A contact stem throughway 406 and throughway separator 416 can be provided through the center of the inner cylindrical portion 405 for allowing contact stems 522 and 622 to pass on either side of throughway separator 416. The throughway separator 416 can include a pair of ridges that run through the center of the contact arm stem throughway 406 and ensure that the hot and neutral contact stems 522 and 622 do not contact each other, arc between each other, or otherwise short each other out. In a preferred embodiment, the pair of ridges can be formed as a single thick ridge.

An outer cylindrical portion 409 can encase the transformer coils 408 and include a plurality of arms 418 extending therefrom to stabilize the transformer boat 400 by spreading out the points of attachment with the circuit board 950. In addition, the plurality of arms 418 create an enclosure around the screw/face terminals 961 to keep the connection face plates 963 from turning and contacting other internal parts of the GFCI device. An alignment post 419 can be integrally formed on the top side of each arm 418 for extension into corresponding alignment holes 324 in the middle housing 300 to ensure alignment of all GFCI components. In addition, contact arm alignment receptacles 422 can extend along a side of the outer cylindrical portion 409 so that alignment tabs 524 and 624 of the hot and neutral contact arms 520 and 620, respectively, can be inserted therein. The specific configuration of the alignment receptacles 422 ensures the critical alignment of the contact arms 520 and 620 with the hot and neutral output terminals 500 and 600.

As discussed previously with respect to the solenoid bobbin 700, a support arm 404 can extend from the outer cylindrical portion 409 of the transformer boat 400 to contact with the shelf 706 of the solenoid bobbin. The support arm 404 and shelf 706 cooperatively strengthen the flexural stability of the circuit board 950. In addition, support arm 404 can be provided with a test resistor throughway 402 that is configured to encapsulate and stabilize the top of a resistor while allowing a resistor lead to extend through the throughway 402 and be bent over the structure forming the throughway 402. The shelf 706 further secures the correct positioning of the test resistor throughway 402 when the test button is depressed. Accordingly, the test resistor lead will be precisely located within the GFCI device and will ensure the working accuracy of the test button. Specifically, test switch arm 502 will be able to repeatedly contact the lead of the test resistor with a high degree of certainty.

The base of the transformer boat 400 can include a lock/alignment pin 412, lock clip 414 and a set of terminal pins 420. The lock alignment/pin extends from the base of the transformer boat and fits into a pivot aperture 953 in the circuit board 950. Lock clip 414 also extends from the base of the transformer boat 400 and, during assembly, is flexed into a clip aperture 952 in the circuit board to lock the transformer boat 400 securely to the circuit board 950. Terminal pins 420 also protrude from an extension of the base of the transformer boat 400 and are electrically connected to the circuit board 950 by soldering or other known attachment structure. Terminal pins 420 are also electrically connected to the transformed coils 408 and communicate to the GFCI circuitry any current changes in the hot and neutral contact arm stems 522 and 622 as sensed by the coils 408.

Figure 17:
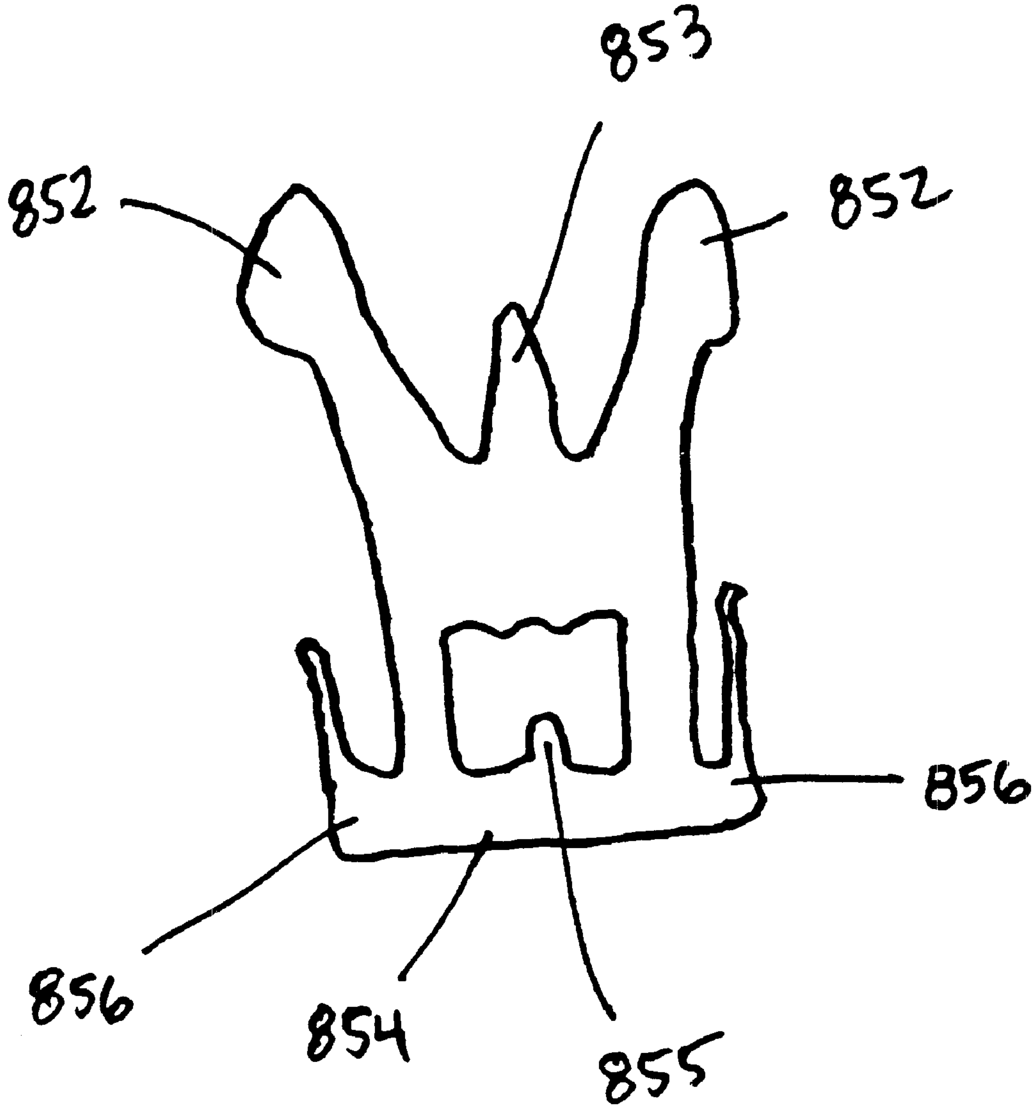
FIG. 17 is a perspective drawing of the circuit desensitizing switch for the GFCI device as shown in FIG. 2.

As shown in FIG. 17, circuit desensitizing switch 850 can be configured as a one-piece structure that has two arms 852 and a contact extension 853. The arm 852 and contact extension 853 extend from a base 854 of the desensitizing switch 850. A tab 855 can be soldered to the circuit board 950 to keep the contact extension 853 centered over a desensitizing contact 851 located on the circuit board 950. When assembled, the base 854 can be electrically connected to the circuit board 950 by a tab 855 that extends from a window of the base portion 854. Two side wings 856 can extend from either side of the base 854 for securing the switch 850 between the solenoid bobbin 700 and the circuit board 950. The arms 852 and contact 853 can be cantilevered upwards and away from the base portion 854 such that they are resiliently positioned over the circuit board. Specifically, the cantilevered configuration permits contact 853 to be resiliently situated above desensitizing contact 851 (shown in FIG. 18A) located on circuit board 950. Contact 853 and arms 852 are also located immediately underneath and along a linear path of the latch block assembly 810. Accordingly, contact 853 can be depressed by the action of side wall ends 857 pressing on arms 852 when latch block assembly 810 moves into its fully tripped position to cause contact 853 to connect with desensitizing contact 851 and deactivate the GFCI device. Thus, the GFCI device can be prevented from sensing further ground faults or activations of the test button until it is reset by the test/reset switch 800.

Figure 18A:
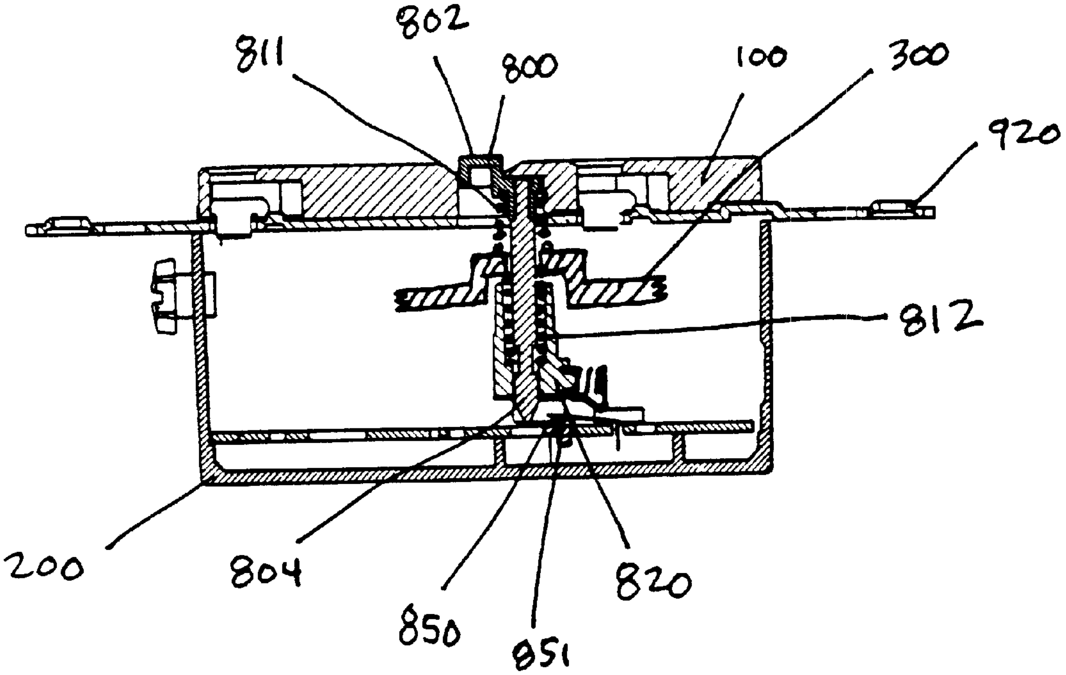
FIGS. 18A–18D are sequential skeleton drawings of the trip/reset structure for the GFCI device as shown in FIG. 2.
Figure 18B:
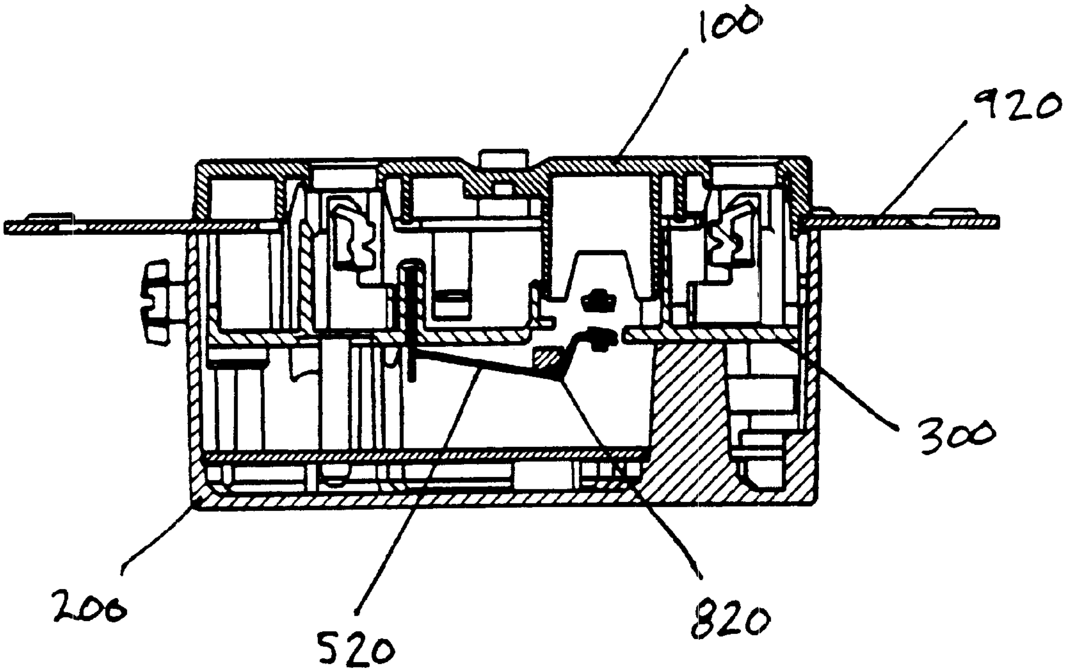

The operation of the test/reset switch 800 will be explained with reference to the sequential skeletal drawings of FIGS. 18A–18D and FIGS. 19A–19C. FIGS. 18A and 18B show the GFCI device in its "tripped" position after the device has sensed a ground fault, the test button has been depressed and the device has not yet been reset, or an electrical component has malfunctioned.

Figure 18C:
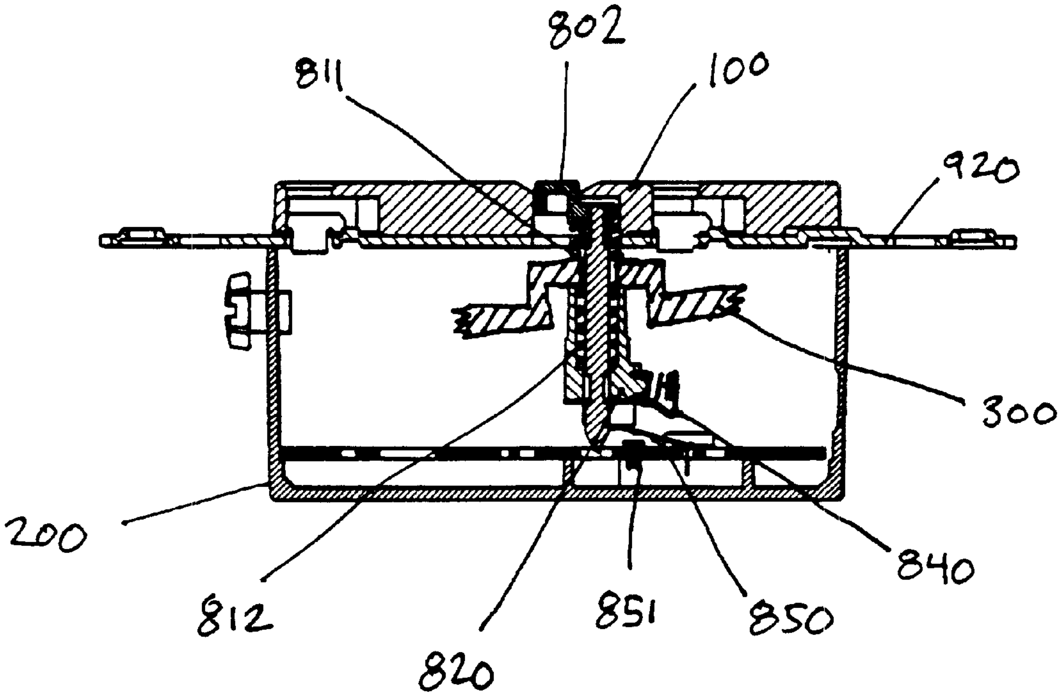
Figure 18D:
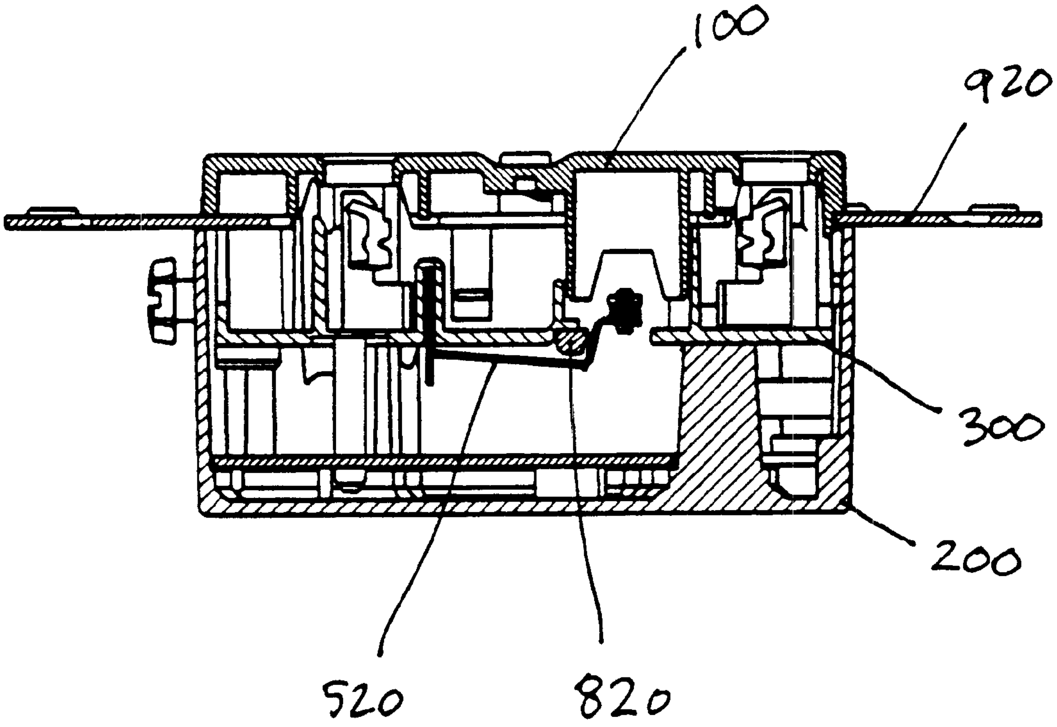

In the "reset" position as shown in FIGS. 18C and 18D, the latch block assembly 810 is retained adjacent the middle housing 300 and above and out of contact with the contact arms 520 and 620. Thus, the hot and neutral current pathways of the GFCI device are closed and permit current to flow to a circuit connected to the GFCI device. Moreover, the elasticity of the cantilevered portions of contact arms 520 and 620 keep the contacts 521 and 621 in electrical connection with contacts 501 and 601 of the hot and neutral output terminal, respectively, to keep the hot and neutral pathways closed when the GFCI device is in its "reset" position.

The latch block assembly 810 is retained in the "reset" position by latch 840, where the middle portion 843 of the latch 840 is locked into latch groove 805 of the reset shaft 804. The locked connection between the latch 840 and the latch groove 805 keeps both the reset spring 811 and the latch block actuation spring 812 in a compressed state. In the "reset" position, the reset button 802 can be slightly spaced apart from the top housing cover 100. This spacing results from compressive forces of reset springs 811 forcing the shield tube 822 of the latch block 820 into contact with the middle housing 300. The position at which the reset shaft 804 is locked by latch 840 to the latch block assembly 820 prevents the reset shaft 804 and reset button 802 from extending to the top housing cover 100.

Figure 19B:
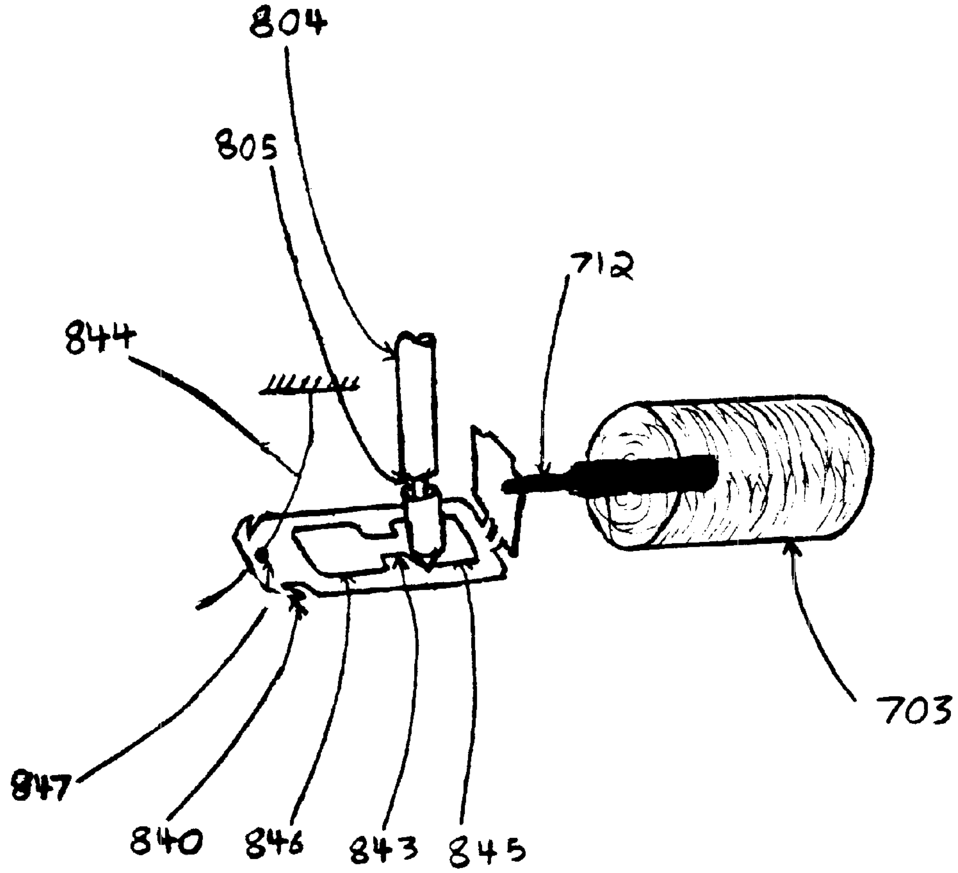
Figure 19C:
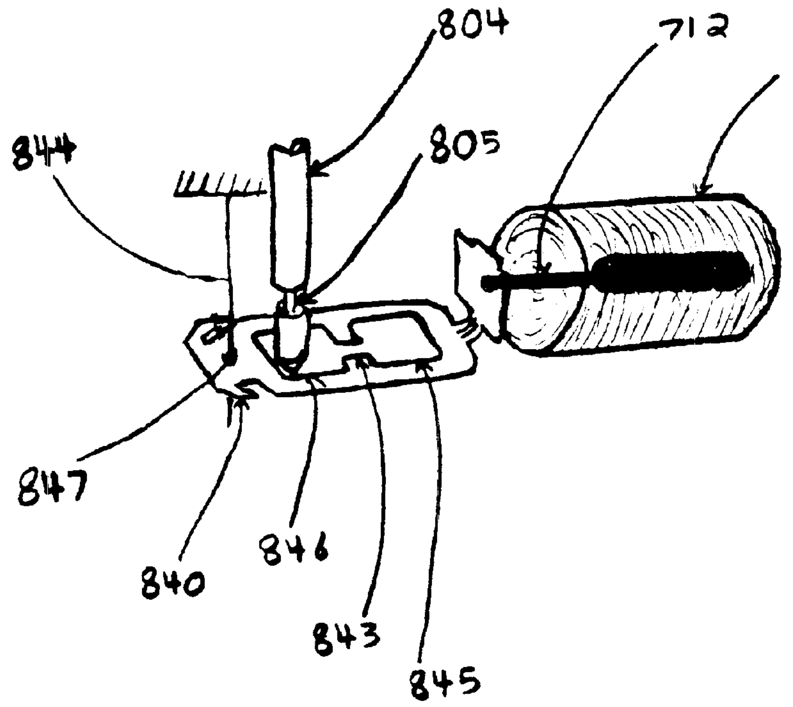

FIGS. 19A–19C show schematic diagrams of the latch 840 in the "reset", "tripped due to a ground fault" and "key electronic component malfunction" state, respectively. In FIG. 19A, in the "reset" state, the middle portion 843 of the latch is locked into latch groove 805, of reset shaft 804. In order to ensure that all the key electronic components of the GFCI are operational, a small simulated ground fault is set up and maintained on the transformer coils 408. The resulting transformer coil 408 output signal causes the IC to output a drive signal to the coil switching device (not shown) to produce a small steady first current to the solenoid coil 703, which subsequently produces a small steady first "testing" force. The small steady first "testing" force can be used to either push or pull the latch 840 by means of the solenoid armature 712 so that the latch middle portion 843 tends to engage the latch groove 805 of the reset shaft 804. The pushing or pulling first "testing" force is equivalent to the opposite pulling or pushing force, respectively, of the hairspring 844. Thus, in the "reset" position, the first "testing" force generated in the axial direction of the solenoid armature 712 is counterbalanced by the force generated by the hairspring 844 on the latch 840, and latch middle portion 843 is biased to align with latch groove 805.

As shown in FIG. 19B in "tripped due to a ground fault" state, if a ground fault is detected, the transformer coil 408 outputs a second signal that causes the IC to output a second drive signal to the coil switching device (not shown) to produce a second current to the solenoid coil 703. The second current causes a second force larger than that produced by the hairspring in the axial direction of solenoid armature 712, to drive the solenoid armature 712 towards the latch 840. This action releases the reset shaft 804 from the latch middle portion 843 of latch 840 and places it within cutout 845. Thus the latch block 820 can move downwards and the reset shaft 804 can move upwards under the bias of reset spring 811 and latch block actuation spring 812 to effect the separation of contacts 501, 521 and 601, 621, as previously discussed.

As shown in FIG. 19C, in the "key electronic component malfunction" state, if one of the key electronic components such as the transformer, the solenoid or the IC of the GFCI malfunctioned, solenoid coil 703 would not apply force to armature 712 as is required to enable resetting of the GFCI device 1. Thus, the coil switching device (not shown) for the transformer fails to produce the required first current to the solenoid coil 703. In absence of the first "testing" force generated by the solenoid coil 703 on the solenoid armature 712, the force generated by the hairspring 844 in the axial direction of the solenoid armature 712 allows latch middle portion 843 to lose its bias to align with groove 805. Thus, the latch block 820 remains in a downward position and reset shaft 804 remains upward under the bias of reset spring 811 and latch block actuation spring 812. Thus, the separation of contacts 501, 521 and 601, 621 is maintained when the components of the GFCI are inoperable or malfunctioning.

In operation, the latch block assembly 810 can be moved from its "reset" position to its "tripped due to a ground fault" or "key electronic component malfunction" position by the force of reset spring 811 and latch block actuation spring 812 when the latch 840 is unlocked from the reset shaft 804. In the "tripped due to a ground fault" state, latch 840 can be unlocked from the reset shaft by the solenoid armature which, when actuated, pushes the striking plate 841 of the latch 840 to cause the latch 840 to slide along the base of the latch block 820 against the force of the hairspring 844. As the latch 840 slides along the base of the latch block 820, latch middle portion 843 is withdrawn from the latch groove 805 in the reset shaft 804 and reset shaft 804 is placed in cutout 845 of latch 840. Thus, the compressive force of the reset spring 811 causes the reset shaft 804 and reset button 802 to move upwards and into contact with the top housing cover 100, while the compressive force of the latch block actuation spring 812 simultaneously causes the latch block assembly 810 to slide linearly down the reset shaft 804. In addition, the linear downward movement of the latch assembly 810 causes the arms 821 of the latch block 820 to contact the cantilevered arm portions of the hot and neutral contact arms 520 and 620, respectively. The contacts 501, 521 and 601, 621 can thus be separated from each other by the force of contact between the latch block arms 821 and the contact arms 520 and 620 as the latch block assembly 810 moves downwardly relative to the reset shaft 804.

After the contacts 501, 521 and 601, 621 have been separated, latch block assembly 810 continues its downward linear motion until it contacts the circuit desensitizing switch 850 and forces it into electrical contact with the desensitizing contact 851 located in the bottom housing 200. Thus, only after contacts 501, 521 and 601, 621 have been opened is it physically possible to close the desensitizing switch 850 with the desensitizing contact 851. The desensitizing switch 850 turns off the ground fault detection mechanism when it is closed with the desensitizing contact 851 to prevent the solenoid from continued repeated activation after the GFCI is tripped. Once the latch block assembly 810 has caused the desensitizing switch 850 to contact the desensitizing contact 851, the GFCI device is considered to be in the fully "tripped" position. In the fully "tripped" position, the reset button abuts the top housing cover 100 by the compressive force of reset spring 811, and the latch block assembly 810 is kept at its lowermost position by compressive force of the latch block actuation spring 812. In addition, the position of the latch block assembly 810 keeps contacts 801, 521 and 601, 621 completely separated from each other and keeps desensitizing switch 850 in contact with the desensitizing contact 851 when in the fully "tripped" position. Thus, the current pathways are opened when the GFCI device is in the fully "tripped" position and the ground fault detection mechanism is desensitized.

The fail safe mode feature keeps the GFCI device in the fully "tripped" position when a component of the GFCI is malfunctioning by including structure that does not permit latch 840 to lock onto the reset shaft 804 and reset the latch block 820 to its reset position. For example, as shown in FIGS. 18A–C, latch 840 can be provided with a middle position 843 between counts 845 and 846. Only when the force of hairspring 844 is counterbalanced by the first "testing" force generated by solenoid 703 can the reset shaft 804 lock onto middle portion 843 to lift the latch block 820 to the reset position. If a key component of the GFCI is inoperable or malfunctioning, the GFCI device will enter into the "key electronic component malfunction" state if an attempt is made to reset the GFCI device. For the "key electronic component malfunction" state, as explained earlier, as the latch 840 slides along the base of the latch block 820, latch middle portion 843 passes by the latch groove 805 in the reset shaft 804 and reset shaft 804 moves into cutout 846 of latch 840. Thus, the GFCI device cannot be reset to allow electricity to pass through when a key component is malfunctioning.

The desensitizing circuit can by any well known circuit for desensitizing an error detection mechanism. The error detection mechanism in the preferred embodiment of the invention can be a ground fault detection mechanism that includes a plurality of transformer coils 408 that detect a change in current flowing through the center of the coils via hot and neutral contact stems 522 and 622. In particular, a ground fault can be sensed by the disclosed configuration because when a ground fault occurs, the current flowing through the hot contact stem 522 will be greater than the current flowing back through the neutral contact stem because a portion of current goes to ground before returning through the neutral contact stem. This net change in current causes a current to be produced in the transformer coils 408 that surround the contact stems 522 and 622. When the produced current reaches a predetermined level, the second electrical current is provided to a solenoid winding 703 which causes the solenoid armature 712 to extend and further push the latch striking plate 841, thus causing the latch block assembly (and eventually the entire GFCI device) to move from the "reset" position to the "tripped" position, to open the current pathways of the GFCI device and prevent further current from going to ground. As explained earlier, the second current produced in the transformer coils 408 as a result of a ground fault is greater than the first current produced in the transformer coils 408 to maintain a simulated ground fault so that the middle portion 843 of latch 840 is biased to align within latch groove 805 of reset shaft 804 when an attempt is made to reset the GFCI device.

Although the preferred embodiment of the invention is disclosed with regard to a ground fault interruption detection circuit, it is possible to incorporate the invention into different types of circuits in which a current pathway is required to be quickly and efficiently opened and prevented from being reclosed in the event of a key component failure. For example, the principles of the invention can be applied to a device that includes an arc fault detection circuit or other types of circuit interrupters.

The material from which the GFCI device is made can also vary without leaving the scope of the invention. In particular, the current pathways structure can be made from any well known electrically conductive material, but is preferably metal and, more specifically, is preferably copper. The transformer coils are preferably made from copper and can be separated from each other and from the exterior of the transformer boat by disc shaped washers. The washers are preferably plastic, but can be made of any electrical insulating material. In addition, instead of using washers, it is possible that the transformer coils can be separated by other electrically insulative devices, such as integral extensions of the transformer boat and/or insulative wrapping material over the transformer coils. The latch block is preferably made from a plastic material, but can be made from any electrically insulative material. The housing structures are also preferably made from a plastic material, but can be made from any electrically insulative material. For, example, the top housing cover 100 can be made from wood, ceramic, marble or other eclectically insulative material that might match the decor of a person's house. Both the transformer boat and solenoid bobbin are preferably made from a plastic material, but can be made from any material that is electrically insulative.

The current pathway structure is preferably constructed as simply as possible to keep the heat generated by the resistance of the current pathway at a minimum. Accordingly, although the contacts 521, 621 and 501, 601 are disclosed as structures that are press fit into throughways located at ends of the two contact arms and two output terminals, respectively, it is not beyond the scope of the invention to make the contacts integral with their respective contact arm or output terminal. In addition, the contacts could be welded, soldered or otherwise electrically connected to their respective contact arms or output terminals.

As state previously, the single electrical connection in each of the current pathways is preferably a solder type connection, but can be any other well known type of electrical connection such as a weld or clamping arrangement.

The springs for use in the test/reset switch are preferably coil type springs and the hairspring 844 is a wire type spring. However, a leaf spring, spring arm, coil spring or any other well known type of spring can be used for the reset spring 811, latch block actuation spring 812 or even the hairspring 844.

For example, a coil spring as disclosed in Application Ser. No. 09/251,427 (referred to above) could be used instead of the hairspring 844 to counterbalance the input from the solenoid 703. Specifically, a coil spring could be placed between the latch block 820 and the striking plate 841 of the latch 840 to counterbalance the force input from the solenoid 703.

It will be apparent to those skilled in the art that various modifications and variations can be made in the error detection device of the invention without departing from the spirit and scope of the invention. Thus, it is intended that the invention cover the modifications and variations of this invention provided they come within the scope of the appended claims and their equivalents.

What is claimed is:

1. A fault circuit interrupter device for stopping current flow through a first circuit when a fault has been detected in the first circuit, the fault circuit interrupter device comprising:

a housing;

a fault detector located in said housing and capable of detecting whether a fault has occurred in the first circuit;

a current path structure located in said housing;

a pair of contact points located in said current path structure and displaceable from each other to open said current path structure and cause current to stop flowing in the first circuit when said fault detector detects that a fault has occurred;

a latch block located adjacent said pair of contact points and moveable such that the latch block can contact a portion of the current path structure to displace said pair of contact points from each other and open said current path structure;

a latch located adjacent said latch block and configured to restrain said latch block from moving relative to said current path structure when said latch is in a first latch position and to permit said latch block to move relative to said current path structure when said latch is in a different latch position; and a test mechanism that determines whether the fault circuit interrupter device is capable of detecting a fault, said test mechanism configured to bias said latch to locate in said first latch position when said test mechanism determines that the fault circuit interrupter is capable of detecting a fault.

2. The fault circuit interrupter device of claim 1, wherein said test mechanism includes first and second biasing members located adjacent said latch, said biasing members positioned to counteract each others' bias and to locate said latch in said first latch position when the test mechanism determines that the fault circuit interrupter is capable of detecting a fault.

3. The fault circuit interrupter device of claim 2, wherein said first biasing member is a spring and said second biasing member is an electrically activated force member.

4. The fault circuit interrupter device of claim 3, wherein said electrically activated force member is a solenoid.

5. The fault circuit interrupter device of claim 1, wherein said test mechanism includes a test member that provides a test fault signal to said fault detector, and said fault detector is configured to output a test output signal when said fault detector receives said test fault signal.

6. The fault circuit interrupter device of claim 5, wherein said test mechanism includes an electrically activated force member that is configured to force said latch into said first latch position when said electrically activated force member receives said test output signal from said fault detector.

7. The fault circuit interrupter device of claim 6, wherein said test mechanism includes a first biasing member that outputs a biasing force on said latch to counteract said force applied by said electrically activated force member to keep said first latch position.

8. The fault circuit interrupter device of claim 7, wherein said fault detector is configured to output a fault signal when a fault is detected in the first circuit, and said first biasing member and said electrically activated force member are configured such that when said fault detector outputs a fault signal, said electrically activated force member is caused to exert a greater force than said biasing force output by said first biasing member, resulting in movement of said latch from said first latch position to said different latch position.

9. The fault circuit interrupter device of claim 1, wherein said latch includes two opening portions adjacent a narrow locking portion.

10. The fault circuit interrupter device of claim 9, wherein said latch block includes a locking member that locks with said narrow locking portion of said latch when said latch is located in said first latch position.

11. The fault circuit interrupter device of claim 10, wherein said locking member is located adjacent one of said opening portions and is unlocked from said narrow locking portion when said latch is located in said different latch position.

12. A method for ensuring that a fault circuit interrupter is working properly, comprising the steps of:

providing a fault circuit interrupter device for stopping current flow through a first circuit when a fault has been detected in the first circuit, the fault circuit interrupter device including a housing a fault detector located in said housing and capable of detecting whether a fault has occurred in the first circuit, a current path structure located in said housing including a pair of separable contact points, a latch block located adjacent said contact points and moveable between a first latch block position and a second latch block position to cause said contact points to separate and open the first circuit when the latch block is moved to said second latch block position, and a test mechanism located in said housing for determining whether the fault circuit interrupter is capable of functioning;

applying a test current to said fault detector such that the fault detector outputs a test signal only when said fault circuit interrupter is capable of functioning; and applying said test signal a force member to cause said force member to position said latch block in said first latch block position.

13. The method of claim 12, wherein said force member is a solenoid.

14. The method of claim 12, further comprising:

providing a latch located adjacent said force member; and exerting a first force on said latch by said force member in response to said test signal being applied to said force member.

15. The method of claim 14, further comprising:

providing a biasing member located adjacent said latch; and exerting a biasing force on said latch via said biasing member to counteract said first force applied to said latch by said force member and to keep said latch located at a first latch position.

16. The method of claim 15, further comprising:

reducing said first force exerted by said force member when no test signal is received from said fault detector such that the biasing force exerted by said biasing member moves said latch away from said first latch position.

17. The method of claim 15, further comprising:

increasing said first force exerted by said force member when said fault detector detects a fault in said first circuit such that the first force exerted by said force member moves said latch away from said first latch position.

18. The method of claim 17, wherein said latch block includes a lock member that is lockable with said latch to keep said latch block from moving to said second latch block position, said latch including an attachment portion and an opening portion, and wherein said lock member is in locking contact with said attachment portion of said latch when said latch is in said first latch position, and said lock member is located adjacent said opening portion and unlocked from said latch when said latch moves from said first latch position.

19. The method of claim 12, further comprising:

permitting said fault circuit interrupter to be reset after the fault detector has detected a fault only if a test signal is being output from said fault detector.

* * * * *